(12) United States Patent
Uebayashi et al.

(10) Patent No.: US 9,871,471 B2
(45) Date of Patent: Jan. 16, 2018

(54) OSCILLATORY WAVE DRIVE DEVICE AND OPTICAL APPARATUS

(71) Applicant: CANON KABUSHIKI KAISHA, Tokyo (JP)

(72) Inventors: Akira Uebayashi, Tokyo (JP); Toshihiro Ifuku, Yokohama (JP); Tatsuo Furuta, Machida (JP); Shinya Koyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 458 days.

(21) Appl. No.: 14/678,837

(22) Filed: Apr. 3, 2015

(65) Prior Publication Data

US 2015/0288298 A1  Oct. 8, 2015

(30) Foreign Application Priority Data

Apr. 7, 2014 (JP) .................................. 2014-079013

(51) Int. Cl.

| | | |
|---|---|---|
| H01L 41/09 | (2006.01) | |
| H01L 41/113 | (2006.01) | |
| H01L 41/107 | (2006.01) | |
| H02N 2/14 | (2006.01) | |
| H02N 2/16 | (2006.01) | |
| G02B 7/04 | (2006.01) | |
| H01L 41/187 | (2006.01) | |

(52) U.S. Cl.
CPC .............. *H02N 2/142* (2013.01); *G02B 7/04* (2013.01); *H02N 2/163* (2013.01); *H01L 41/1871* (2013.01)

(58) Field of Classification Search
CPC ....... H01L 41/09; H01L 41/107; H01L 41/113; H02N 2/142; H02N 2/163; G01B 7/04
USPC ........................ 310/316.01, 316.02, 317–319
See application file for complete search history.

(56) References Cited

U.S. PATENT DOCUMENTS

| | | | |
|---|---|---|---|
| 6,100,654 A | 8/2000 | Izukawa et al. | |
| 6,133,671 A | 10/2000 | Atsuta et al. | |
| 2003/0197447 A1* | 10/2003 | Yamamoto ............. | H02N 2/163 310/323.05 |

(Continued)

FOREIGN PATENT DOCUMENTS

| | | |
|---|---|---|
| CN | 1619316 A | 5/2005 |
| CN | 202750022 U | 2/2013 |

(Continued)

*Primary Examiner* — Thomas Dougherty
(74) *Attorney, Agent, or Firm* — Canon USA, Inc. I.P. Division

(57) ABSTRACT

An oscillatory wave drive device has an oscillatory wave driving unit having an electromechanical energy conversion element having drive phases and a detection phase, a diaphragm, and a rotor, in which a traveling wave is generated on the surface of the diaphragm of the electromechanical energy conversion element to drive the rotor, and the driving speed of the rotor is controlled based on a signal of the phase difference detecting unit. In the oscillatory wave drive device, a detection phase voltage step-down unit and a drive phase voltage step-down unit each containing a resistance voltage dividing circuit having at least two resistors are provided and the voltage dividing ratio in the resistance voltage dividing circuit of the detection phase voltage step-down unit is lower than 1/1 and higher than 1/20.

8 Claims, 10 Drawing Sheets

(56) References Cited

U.S. PATENT DOCUMENTS

2011/0068718 A1    3/2011  Murakami

FOREIGN PATENT DOCUMENTS

| | | |
|---|---|---|
| JP | S62-085684 A | 4/1987 |
| JP | 2011-067035 A | 3/2011 |
| KR | 10-2011-0046003 A | 5/2011 |
| KR | 10-2014-0037940 A | 3/2014 |
| WO | 2013/002298 A1 | 1/2013 |

* cited by examiner

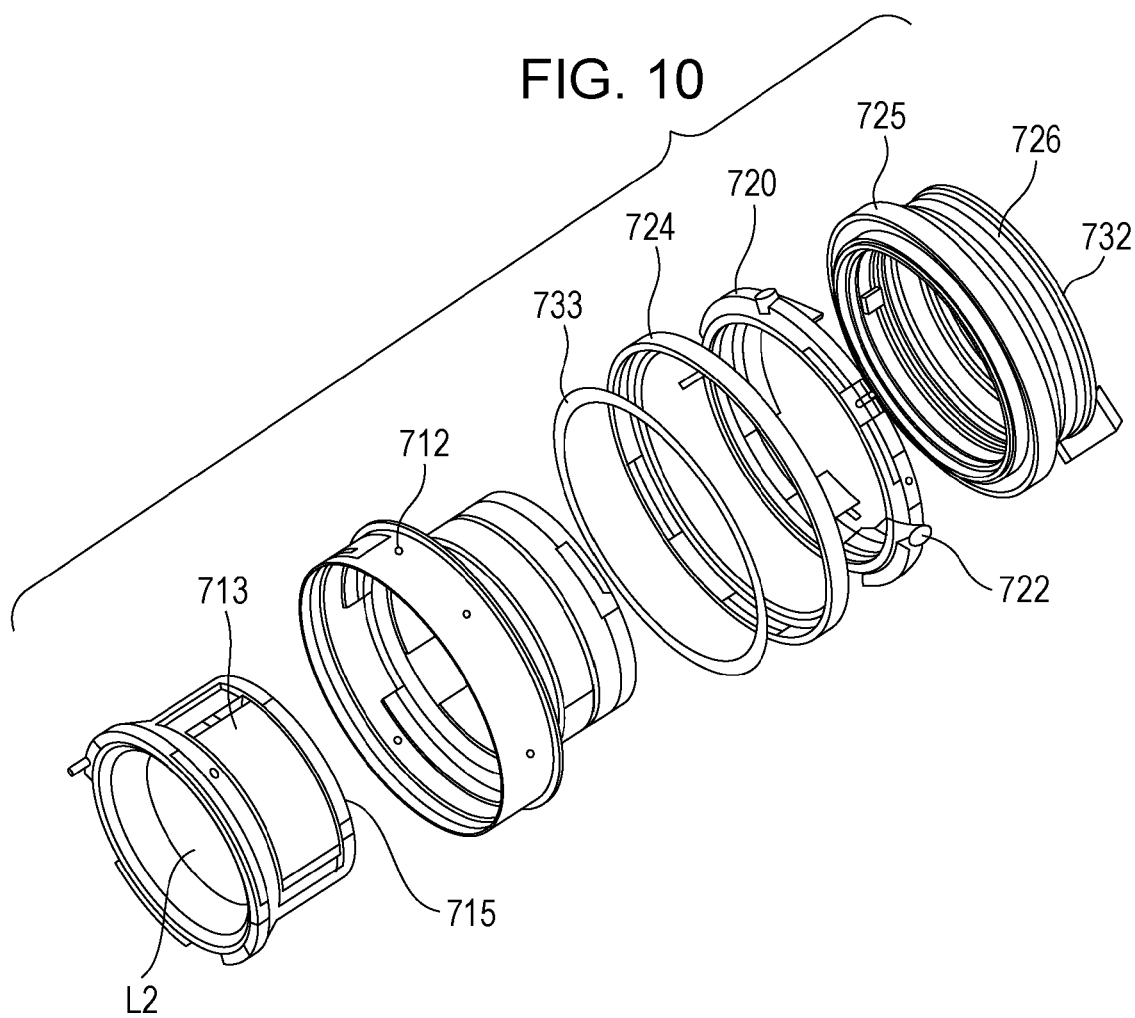

OSCILLATORY WAVE DRIVE DEVICE AND OPTICAL APPARATUS

BACKGROUND OF THE INVENTION

Field of the Invention

The present invention relates to an oscillatory wave drive device and an optical apparatus having the same.

Description of the Related Art

An oscillatory type (oscillatory wave) actuator has a vibrator in which drive oscillation is excited in an elastic body of an annular shape, a long oval shape, a rod shape, or the like by applying electric signals, such as an alternating voltage, to an electromechanical energy conversion element, such as a piezoelectric element. As a specific oscillatory type actuator, it has been suggested to utilize the same as an oscillatory wave motor which relatively move the elastic body which is brought into contact with the vibrator under pressure and the vibrator, for example.

The outline of an annular-shaped oscillatory wave motor is described below as an example.

The annular-shaped oscillatory wave motor has an annular-shaped piezoelectric material having a bore diameter and an outer diameter in which the entire circumferential length is an integral multiple of a certain length $\lambda$. A plurality of electrodes are provided on one surface of the piezoelectric material and a common electrode which are common to the piezoelectric material is provided on the opposite surface, whereby a piezoelectric element is formed.

The plurality of electrodes contain two drive phase electrodes, a detection phase electrode, and non-drive phase electrodes. Electric fields are applied to the piezoelectric material of each drive phase electrode unit at a $\lambda/2$ pitch alternately in opposite directions, so that polarization treatment is performed. Therefore, the polarity of expansion and contraction of the piezoelectric material with respect to the electric fields in the same direction are opposite to each other at each $\lambda/2$ pitch. The two drive phase electrodes are disposed while providing interval portions of odd number times of $\lambda/4$. In usual, the piezoelectric material facing the interval portion is provided with the non-drive phase electrode so as not to spontaneously cause piezoelectric oscillation, and the common electrode and short circuit lines or the like are short circuited.

The detection phase electrode is an electrode for detecting the oscillation state of the piezoelectric material and may be freely provided insofar as the oscillation is not considerably impaired, and is provided between the two drive phase electrodes in many cases. Distortion arising in the piezoelectric material of the detection phase electrode unit is converted to an electric signal according to the piezoelectric constant of the piezoelectric material, and then output to the detection phase electrode.

A conductive line which inputs/outputs power is disposed in the piezoelectric element and a diaphragm containing an elastic body is further attached thereto. The resultant piezoelectric element is used as a stator. When an alternating voltage is applied to one drive phase electrode of the stator, a standing wave of a wavelength $\lambda$ arises in the diaphragm over the entire circumference of the diaphragm. When an alternating voltage is applied only to the other drive phase electrode, a standing wave similarly arises. However, since the interval portions are provided as described above, the position thereof is a position which is rotated and moved in the circumferential direction using the length of $\lambda/4$ as the unit with respect to the standing wave.

One in which an annular elastic body is brought into contact as a rotor, under pressure, with the surface opposite to the diaphragm of the stator is an annular-shaped oscillatory wave motor.

As another system, an oscillatory wave motor is also mentioned which can be driven by rotating a rotor due to expansion/contraction oscillation of an annular-shaped piezoelectric material in a state where electrodes and a diaphragm are attached to the inner side and the outer side of the piezoelectric material and the rotor is brought into contact with the inner side or the outer side under pressure.

When alternating voltages having the same frequency and having a time-related phase difference of $\pi/2$ are simultaneously applied to each drive phase electrode of such an oscillatory wave motor, two generated standing waves are synthesized. As a result, a traveling wave (wavelength $\lambda$) of bending oscillation which travels in the circumferential direction arises in the diaphragm.

In this case, each point on the side of the rotor of the diaphragm performs a certain oval movement, and therefore the rotor receives frictional power in the circumferential direction from the diaphragm to rotate relatively to the stator. The rotation direction of the rotor can be reversed by switching the phase difference in the alternating voltage applied to each drive phase electrode to a positive phase or a negative phase.

The rotation speed of the oscillatory wave motor is determined based on the driving frequency (frequency of the alternating voltage to be applied).

When driving the oscillatory wave motor during a stop, the rotation operation is started by applying an alternating voltage having a driving frequency whose frequency is higher than the resonance frequency of the oscillatory wave motor. Then, control of gradually bringing the driving frequency close to the resonance frequency is performed. The rotation speed is further accelerated as the driving frequency is brought closer to the resonance frequency of the oscillatory wave motor. Then, the rotation speed reaches the highest rotation speed at the resonance frequency. Thus, the oscillatory wave motor can perform drive at a desired rotation speed by sweeping frequencies from a frequency region higher than the resonance frequency toward the resonance frequency.

By connecting an appropriate control means to the oscillatory wave motor according to a purpose, a drive control system capable of controlling the rotation speed can be produced. In particular, a phase difference detecting means (also referred to as a phase comparator) which compares phases, and then outputs a voltage value according to the comparison results is connected to the control means in many cases.

In the case where the phase difference detecting means is adopted, when the oscillatory wave motor is driven, an electric signal (1) to be output from the detection phase electrode according to the amplitude of the oscillation arising in the detection phase electrode unit is input into the phase difference detecting means together with an electric signal (2) applied to the drive phase electrode. Then, the deviation degree from the resonance state can be grasped based on phase difference information output from the phase difference detecting means. The frequency of the electric signal to be applied to the drive phase electrode is determined in the control means based on the information, and then a desired traveling wave is generated, whereby the rotation speed of the rotor can be feedback-controlled.

However, the maximum input voltage value of a general phase difference detecting means is variously limited and thus is not large. Therefore, the voltage values of the electric signals (1) and (2) are usually voltage values exceeding the maximum input voltage value of the phase difference detecting means. Therefore, an oscillatory wave motor control system described in Japanese Patent Laid-Open No. 62-85684, for example, is provided with a mechanism (voltage step-down circuit) for stepping down the voltage level to the voltage of the logic level before the electric signals (1) and (2) are input into the phase difference detecting means to step down the voltage.

In the oscillatory wave motor, when the frequency of the alternating voltage to be applied to the drive phase electrode is changed to be lower than the resonance frequency before the feedback control by the control means based on the phase difference information output from the phase difference detecting means is performed, the rotation of the rotor stops (which is also referred to as a cliff step-down phenomenon). In order to prevent the phenomenon, it is devised that a detection permissible error of the phase difference between the electric signals (1) and (2) which can be input into the phase difference detecting means is set to limit excessive lowering of the frequency of the alternating voltage.

In order for the phase difference detecting means to distinguish the voltage values of the electric signals (1) and (2), the voltage values of the electric signals (1) and (2) need to be equal to or lower than the minimum voltage value in terms of the part performance of the phase difference detecting means. It is a matter of course that the phase difference detecting means cannot distinguish voltage values in a range deviating from the range of the resolution and the accuracy of voltage detection values of the phase difference detecting means.

Immediately after the rotation of the oscillatory wave motor starts, i.e., at the early stage of rotation, the drive is started at a driving frequency considerably far from the resonance frequency, and therefore the oscillation amplitude in the detection phase electrode unit is small and the electric signal (1) to be output from the detection phase electrode is small. Accordingly, the lowest rotation speed at which the phase difference detecting means distinguishes the electric signal (1), and the control means can perform the feedback control is determined based on the minimum detection value of the phase difference detecting means.

Hereinafter, the cause of a problem in that the electric signal (1) varies in each oscillatory wave motor is described referring to individual factors.

The traveling wave generated in the oscillatory wave motor does not necessarily have a completely single oscillation mode. Therefore, turbulence of the waveform of the traveling wave arises under the influence of other oscillation modes contained in the traveling wave. Moreover, the influence of the other oscillation modes has individual differences among oscillatory wave motors. Therefore, even when the alternating voltages to be input into the drive phase electrodes are the same, the oscillation amplitude in the detection phase electrode unit varies. Therefore, the electric signal (1) to be output from the detection phase electrode also varies (factor 1).

When a resistance voltage dividing circuit containing at least two resistors is considered as the mechanism of a voltage step-down circuit of stepping down a voltage in order to input the same into the phase difference detecting means, the variation of the factor 1 of the electric signal (1) to be output from the detection phase electrode is further increased due to an individual variation of the resistance values due to a part error of the resistors (factor 2).

Since the electric signal (1) varies due to the factor 1 and the factor 2, the voltage value in the phase difference detecting means of the electric signal (1) which actually allows the control means to perform the feedback control is much higher than the minimum voltage value as the part performance of the phase difference detecting means described above. Therefore, it has been difficult to perform the feedback control from the early stage of rotation in former techniques.

The present invention has been made in view of such a background art and provides an oscillatory wave drive device which can lower the minimum input voltage value at which a control circuit can correctly judge a phase difference, so that feedback control can be performed from the early stage of rotation and an optical apparatus employing the same.

SUMMARY OF THE INVENTION

An oscillatory wave drive device of the present invention for solving the above-described problems has an oscillatory wave driving unit having an electromechanical energy conversion element having at least two drive phase electrodes and a detection phase electrode, a diaphragm, and a rotor, a drive phase power output unit which supplies a drive phase voltage to the oscillatory wave driving means, a drive phase voltage step-down unit which steps down the voltage to be supplied, a detection phase voltage step-down unit which steps down a detection phase voltage detected through the detection phase electrode, a phase difference detecting unit which detects a phase difference between the drive phase voltage and the detection phase voltage, and a control unit which controls the drive phase power output unit according to an output of the phase difference detecting unit, in which alternating voltages different from each other in phase are applied to the two drive phase electrodes of the electromechanical energy conversion element to thereby generate a traveling wave on the surface of the diaphragm, the rotor is driven by the traveling wave, and the drive state of the rotor is controlled by the control unit at least based on a signal of the phase difference detecting unit, and the detection phase voltage step-down unit and the drive phase voltage step-down unit each contain a resistance voltage dividing circuit having at least two resistors, and the voltage dividing ratio in the resistance voltage dividing circuit of the detection phase voltage step-down unit is lower than 1/1 and higher than 1/20.

An optical apparatus of the present invention for solving the above-described problems has the above-described oscillatory wave drive device.

Further features of the present invention will become apparent from the following description of exemplary embodiments with reference to the attached drawings.

BRIEF DESCRIPTION OF THE DRAWINGS

FIG. 10 is a schematic view showing one embodiment of the optical apparatus of the present invention.

DESCRIPTION OF THE EMBODIMENTS

Hereinafter, an aspect of an oscillatory wave drive device for implementing the present invention is described. As an aspect for implementing the oscillatory wave drive device of the present invention, an annular type oscillatory wave motor is described below but the present invention is not limited thereto and can be applied also to oscillatory wave motors of a multilayered type and a rod type.

Oscillatory Wave Drive Device

An oscillatory wave drive device of the present invention has
an oscillatory wave driving unit having an electromechanical energy conversion element having at least two drive phase electrodes and a detection phase electrode, a diaphragm, and
a rotor,
a drive phase power output unit which supplies a drive phase voltage to the oscillatory wave driving means,
a drive phase voltage step-down unit which steps down the voltage to be supplied,
a detection phase voltage step-down unit which steps down a detection phase voltage detected through the detection phase electrode,
a phase difference detecting unit which detects a phase difference between a drive phase voltage and a detection phase voltage,
a control unit which controls the drive phase power output unit according to an output of the phase difference detecting unit,
in which alternating voltages different from each other in phase are applied to the two drive phase electrodes of the electromechanical energy conversion element to thereby generate a traveling wave on the surface of the diaphragm, the rotor is driven by the traveling wave, and the drive state of the rotor is controlled by the control unit at least based on a signal of the phase difference detecting unit, and
the detection phase voltage step-down unit and the drive phase voltage step-down unit each contain a resistance voltage dividing circuit having at least two resistors, and the voltage dividing ratio in the resistance voltage dividing circuit of the detection phase voltage step-down unit is lower than 1/1 and higher than 1/20.

Figure 1:
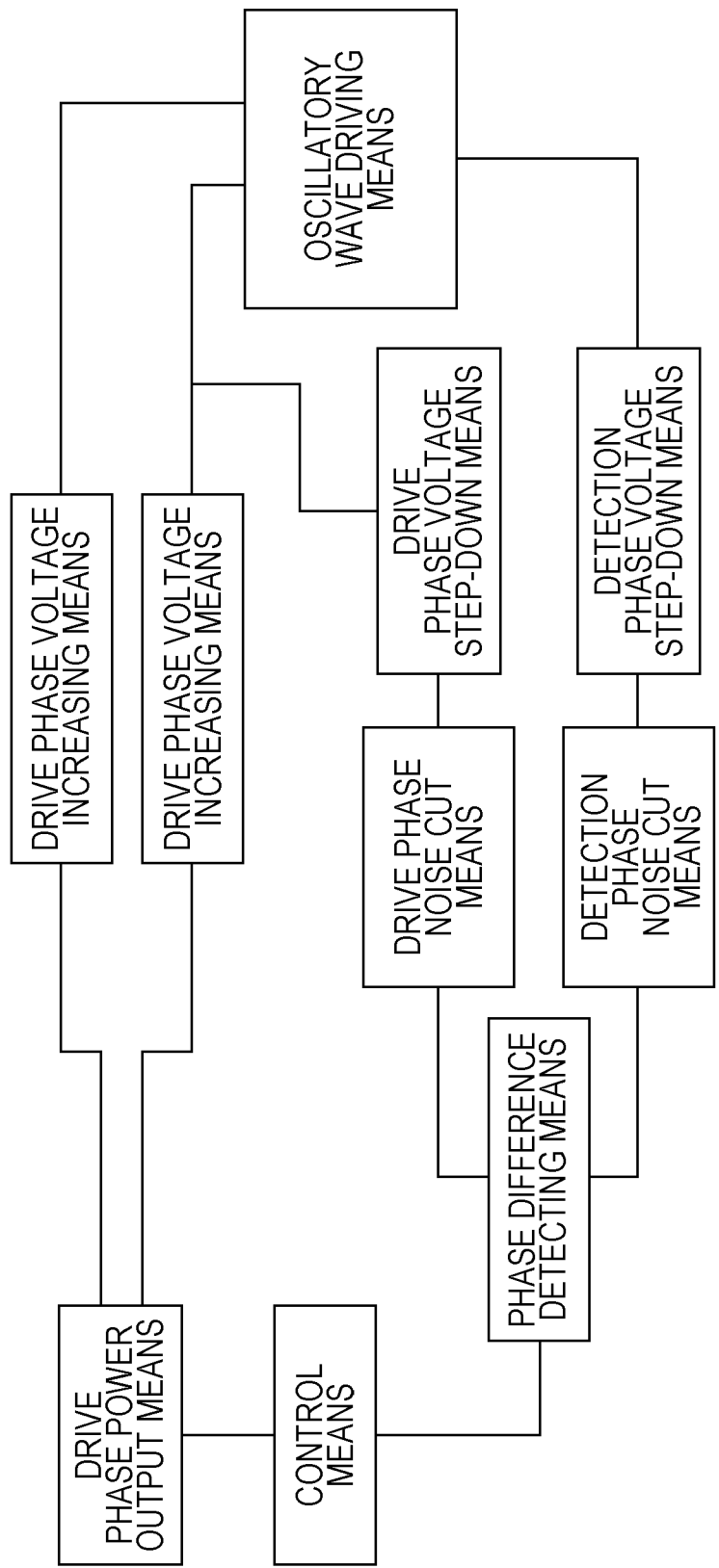
FIG. 1 is a schematic view showing one embodiment of an oscillatory wave drive device of the present invention.

FIG. 1 is a schematic view showing one embodiment of the oscillatory wave drive device of the present invention. A method for driving and controlling an annular type oscillatory wave motor is as follows.

The rotation speed of the annular type oscillatory wave motor is determined by a driving frequency. A rotation operation is started in a frequency region higher than the resonance frequency of the annular type oscillatory wave motor, the driving frequency is brought close to the resonance frequency to thereby increase the rotation speed, and then the rotation speed reaches the highest rotation speed at the resonance frequency. Thus, the annular type oscillatory wave motor can perform drive at a desired rotation speed by sweeping frequencies from the frequency region higher than the resonance frequency toward the resonance frequency.

In a method for controlling the annular type oscillatory wave motor, the drive phase power output means first outputs alternating voltages (voltages) of a predetermined frequency which are different from each other in phase to a plurality of drive phase voltage increasing means based on the command of a control means (control unit). It is a matter of course that the configuration for increasing the voltage has a plurality of choices but a user may adopt a desired configuration according to the intended use or a drive phase voltage increasing means may be omitted, if unnecessary, to reduce the size.

The drive phase voltage increasing means increases the voltage output from the drive phase power output means. The increased voltage is input into each drive phase of the oscillatory wave driving means. When alternating voltages different in phase are input into a plurality of drive phases, a traveling wave having a predetermined amplitude is generated in a stator, and then the rotor rotates. The amplitude of the traveling wave generated in the stator is converted to an alternating voltage (voltage) in the detection phase of the oscillatory wave driving means. A part of a voltage to be input into the drive phase is stepped down by the drive phase voltage step-down means. Separately, a voltage output from the detection phase is stepped down by the detection phase voltage step-down means. It may be configured so that the stepped-down voltages of the drive phase and the detection phase are input into the phase difference detecting means through a noise cut means as illustrated in FIG. 1. The phase difference detecting means detects a phase difference between the input voltages of the drive phase and the detection phase. A frequency difference from the resonance frequency of the annular type oscillatory wave motor can be distinguished from the detected phase difference signal. The control means performs an arithmetic operation based on the result, and then gives a command again to the drive phase power output means. As a result of repeating a series of the processes, the annular type oscillatory wave motor can control the rotation speed.

However, in the traveling wave generated by simultaneously applying alternating voltages different from each other in phase to each drive phase electrode of the oscillatory wave motor, turbulence of the waveform of the traveling wave arises under the influence of other oscillation modes as described above. Moreover, since there are individual differences in the influence of the other oscillation modes, the oscillation amplitude of the detection phase varies due to the individual differences among the other oscillation modes even when the alternating voltages to be input into the drive phase electrodes are the same. Therefore, the electric signals to be output from the detection phase electrode also vary. When a resistance voltage dividing circuit containing at least two resistors is considered as the mechanism of a voltage step-down circuit of stepping down a voltage in order to input the same into the phase difference detecting means, the variation of the electric signals to be output from the detection phase electrode is further increased due to an individual variation of the resistance values due to a part error of the resistors.

Figure 2:
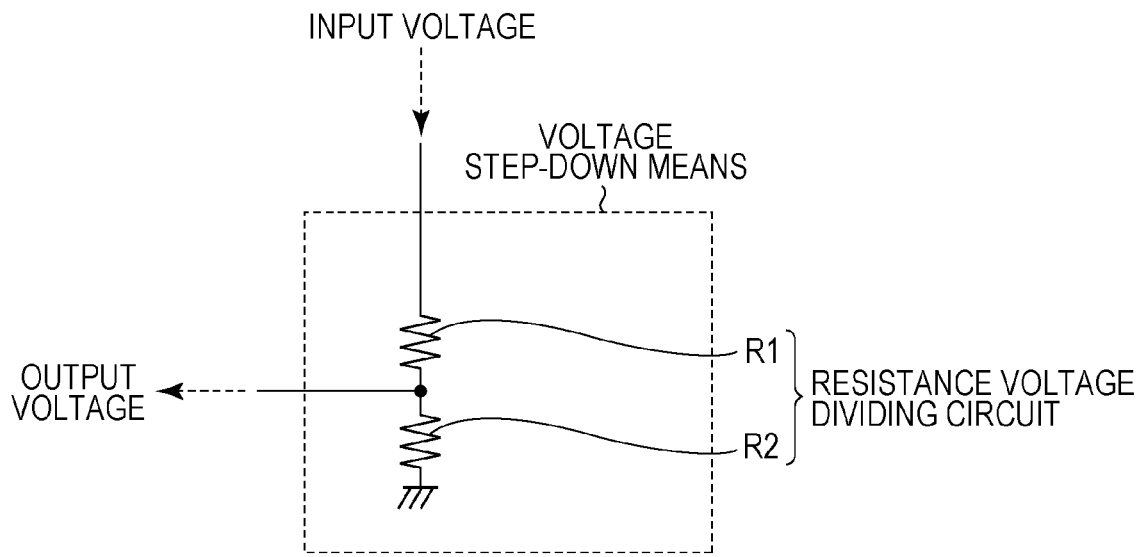
FIG. 2 is a schematic view of a voltage step-down circuit employing resistors in a voltage step-down means for use in the oscillatory wave drive device of the present invention.

FIG. 2 is a schematic view of a voltage step-down circuit using the resistors in the voltage step-down means of the present invention and is a general resistance voltage dividing circuit. In the resistance voltage dividing circuit illustrated in FIG. 2, when the resistance value of the resistor R1 is defined as R1 and the resistance value of the resistor R2 is defined as R2, the voltage to be output can be expressed by the following expression.

$$\text{Output voltage} = \text{Input voltage} \times \frac{R_2}{R_1 + R_2} = \text{Input voltage} \times \frac{1}{1 + \frac{R_1}{R_2}}$$

Herein, the relational expression of R1 and R2 shown below $$\frac{R_2}{R_1 + R_2} \text{ OR } \frac{1}{1 + \frac{R_1}{R_2}}$$

is defined as the voltage dividing ratio. Even when the electric signals to be output from the detection phase electrode have the same value, the electric signal whose voltage is stepped down by the detection phase voltage step-down means includes a variation because the voltage dividing ratio varies under the influence of the variation of the resistor R1 and the resistor R2. The variation of the voltage dividing ratio can be expressed by the following expression.

$$\text{Variation of voltage dividing ratio} = \frac{\text{Maximum voltage dividing ratio} - \text{Minimum voltage dividing ratio}}{\text{Ideal voltage dividing ratio}}$$

The individual variation of the resistors is generally disclosed by % as a part error. Therefore, when the individual variation of the resistors is indicated by (100×n) % (in which 100×n represents an integer and n represents a decimal), the variation of the voltage dividing ratio can be expressed by the following expression using the voltage dividing ratio.

$$\text{Variation of voltage dividing ratio} = \frac{\frac{1}{1 + \frac{R_1(1-n)}{R_2(1+n)}} - \frac{1}{1 + \frac{R_1(1+n)}{R_2(1-n)}}}{\frac{1}{1 + \frac{R_1}{R_2}}}$$

Herein, when the ratio of the resistors of R1 to R2 is defined as follows.

$$\frac{R_1}{R_2} = X$$

the variation of the voltage dividing ratio is expressed as follows.

$$\text{Variation of voltage dividing ratio} = \frac{4n \times \left(\frac{1}{X} + 1\right)}{\left(\frac{1+n}{X} + 1 - n\right) \times \left(\frac{1-n}{X} + 1 + n\right)}$$

Figure 3:
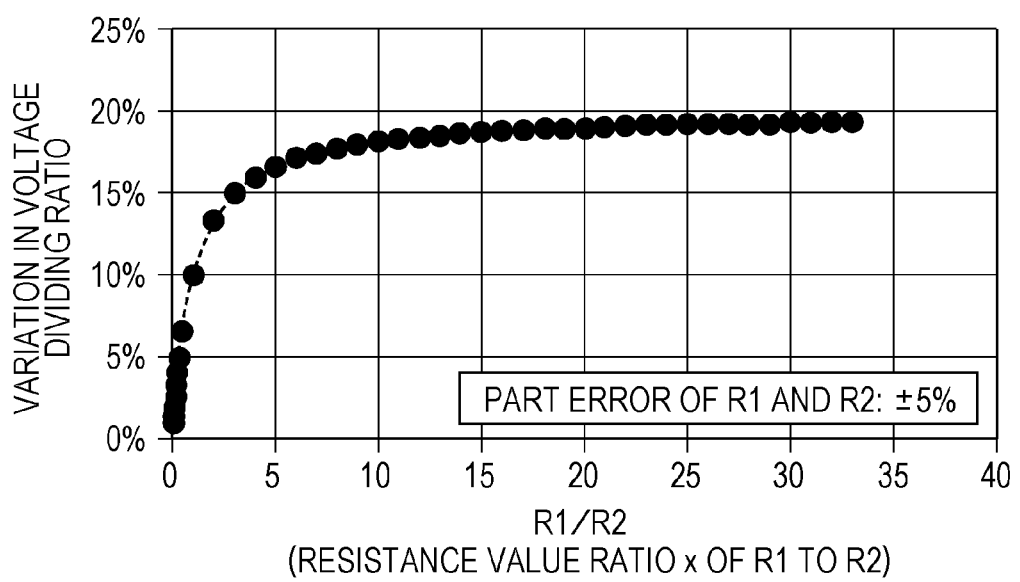
FIG. 3 is a relationship diagram of a variation of a resistance value ratio and a voltage dividing ratio in the voltage step-down circuit employing resistors for use in the oscillatory wave drive device of the present invention.

FIG. 3 is a relationship diagram of "Variation of voltage dividing ratio" and "Resistance value ratio (X) of R1 to R2" when the part error of the resistor R1 and the resistor R2 is 5%. When the variations of the resistor R1 and the resistor R2 are the same, the variation of the voltage dividing ratio can be reduced by reducing the resistance value ratio (X) of R1 and R2.

In order to perform the feedback control at the early stage of rotation of the annular type oscillatory wave motor, it is necessary to detect the rotation speed and the driving frequency in the region smaller than 10 rpm in the phase difference detecting means. By detecting the rotation speed and the driving frequency in a region smaller than 10 rpm, it is possible to perform the feedback control from the early stage of rotation. In an optical apparatus employing the annular type oscillatory wave motor, for example, autofocus can be achieved at a higher speed. Moreover, also in a focusing operation by fine drive, an increase in speed can be expected. Furthermore, also in an operation requiring focusing by continuous fine drive as in movie shooting, the stability of the focusing can be expected.

When a detection permissible error of the phase difference for preventing a phenomenon in which the frequency of an electric signal to be applied to the drive phase electrode is changed to be lower than the resonance frequency, so that the rotation of the rotor stops is set to 30°, the minimum voltage which can be distinguished by the phase difference detecting means is set to 0.15 V, and the ideal voltage dividing ratio by the detection phase voltage step-down means is set to 1/21, a voltage value which needs to be input into the phase difference detecting means can be calculated by the following expression.

$$\text{Voltage value} = \frac{0.15 \times 21}{\sin(30°)} = 6.3 \text{ V}$$

However, in actual, the voltage value which needs to be input into the phase difference detecting means is a value larger than 6.3 V due to the part error of the resistors by the detection phase voltage step-down means and the variation of the electric signals to be output from the detection phase electrode.

Herein, when the part error of the resistor R1 and the resistor R2 in the detection phase voltage step-down means is set to 5%, the actual voltage dividing ratio to the ideal voltage dividing ratio 1/21 is in the range of 21/401 (1/19.1) to 19/439 (1/23.1) and the voltage value which needs to be input into the phase difference detecting means is a value of 5.7 V to 6.9 V.

Furthermore, when the variation of the electric signals to be output from the detection phase electrode is set to ±10%, the voltage value which needs to be input into the phase difference detecting means is 7.6 V in order for the phase difference detecting means to correctly distinguish also in the case of this variation. The voltage value thus calculated, which the detection phase needs to output at the minimum when starting drive, with respect to the voltage dividing ratio is defined as the minimum detectable voltage in starting drive.

The electric signals to be output from the detection phase electrode have a proportional correlation with the rotation speed of the oscillatory wave motor due to the oscillation amplitude of the detection phase.

When a piezoelectric material of the electromechanical energy conversion element to be used is lead zirconate titanate, in order to achieve detection of a rotation speed lower than 10 rpm, the voltage dividing ratio needs to be a voltage dividing ratio higher than 1/20 from the correlation of the voltage value to be output from the detection phase and the rotation speed.

More specifically, by the use of a voltage dividing ratio lower than 1/1 and higher than 1/20, the variation of the electric signals generated by the detection phase voltage step-down means can be reduced and the phase difference between the voltage of the detection phase and the voltage of the drive phase to be input into the phase difference detecting means can be more correctly judged. This makes it possible to correctly distinguish a frequency difference from the resonance frequency of the annular type oscillatory wave motor and to further reduce the minimum value of the input voltage value, at which the control circuit can correctly judge the phase difference, than before. Therefore, the feedback control can be performed from an earlier stage of rotation. Consequently, the oscillatory wave motor can be controlled from the early stage of the starting of rotation, in other words, immediately after the drive, precise rotation control capable of performing small turns can be achieved.

The voltage dividing ratio is more suitably less than 1/1 and higher than 1/10. The voltage dividing ratio is still more suitably lower than 1/1 and higher than 1/3.

In the region where the voltage dividing ratio is higher than 1/1, i.e., the region where amplification is performed, a noise component is also amplified, and therefore it becomes impossible to correctly perform the phase difference detection. Thus, such a region is not suitable.

Moreover, in the region where the voltage dividing ratio is lower than 1/20, a rotation speed lower than 10 rpm cannot be detected, and therefore the feedback control at the early stage of rotation cannot be performed.

Figure 4:
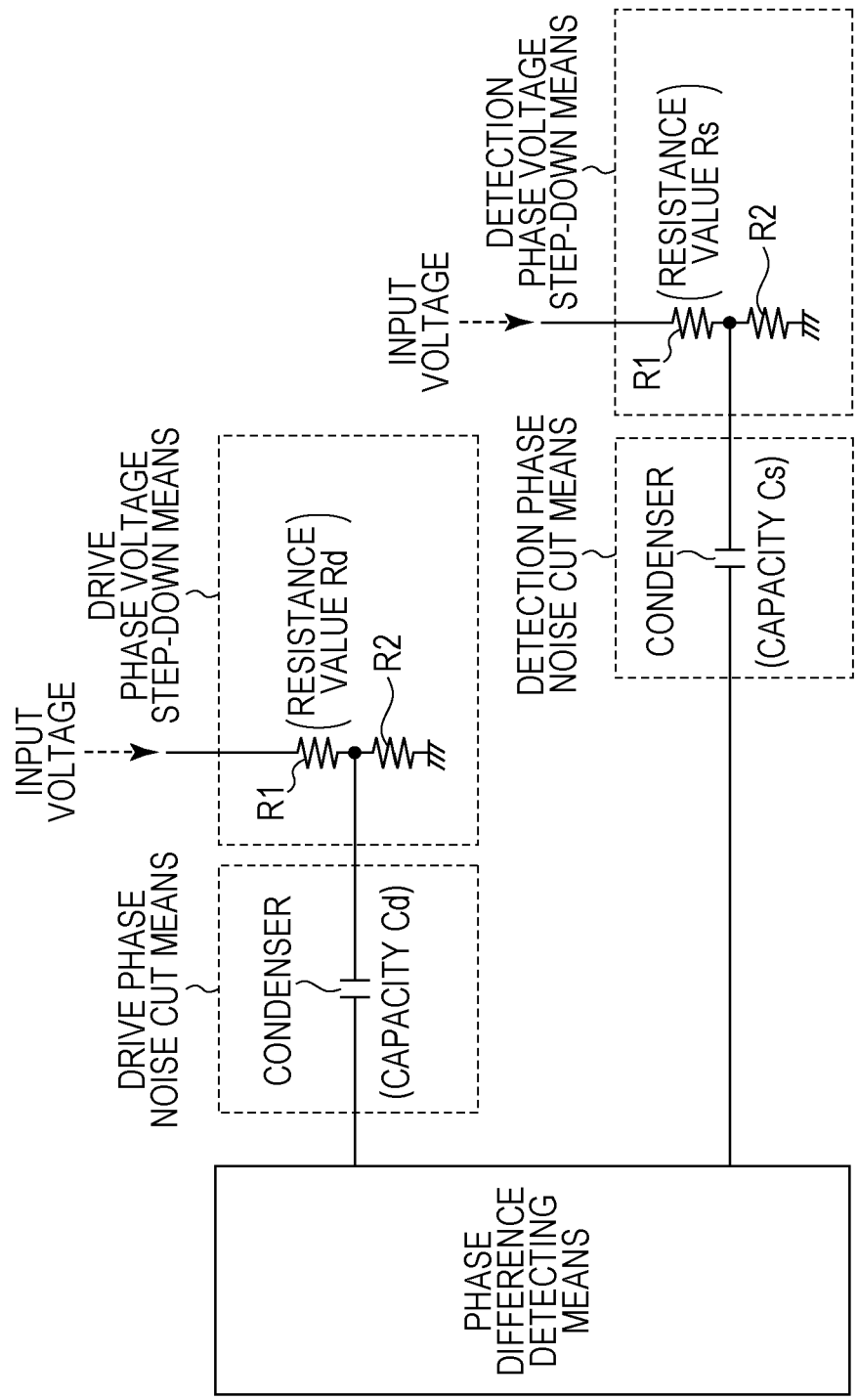
FIG. 4 is a schematic view of the circuit arrangement of the oscillatory wave drive device of the present invention when a condenser is used as a noise cut means for use in the oscillatory wave drive device of the present invention.

FIG. 4 selectively shows the phase difference detecting means, the drive phase noise cut means, the drive phase voltage step-down means, the detection phase noise cut means, and the detection phase voltage step-down means of the oscillatory wave drive device of the present invention illustrated in FIG. 1 and a circuit arrangement diagram when condensers are used as the noise cut means. As the drive phase noise cut means, a condenser having a capacity Cd is disposed in series between the drive phase voltage step-down means and the phase difference detecting means. As the detection phase noise cut means, a condenser having a capacity Cs is disposed in series between the detection phase voltage step-down means and the phase difference detecting means.

As a part of the drive phase voltage step-down means, a resistor having a resistance value Rd is disposed in series to the condenser having a capacity Cd. As a part of the detection phase voltage step-down means, a resistor having a resistance value Rs is disposed in series to the condenser having a capacity Cs. Therefore, the stepped-down voltages of the drive phase and the detection phase are input into the phase difference detecting means through the noise cut means, and a frequency response difference of a time constant $\tau$ arises in the RC circuit in this case. The time constant $\tau$ can be expressed by the following expression.

$$\tau = RC$$

In order to reduce the frequency response difference of the time constant $\tau$, the relationship among Cd, Rd, Cs, and Rs suitably satisfies $0.90 \leq CdRd/CsRs \leq 1.10$. The reduction in the frequency response difference makes it becomes possible to more correctly judge the phase difference between the voltage of the detection phase and the voltage of drive phase to be input into the phase difference detecting means. $CdRd/CsRs = 1.00$ is still more suitable.

Figure 5:
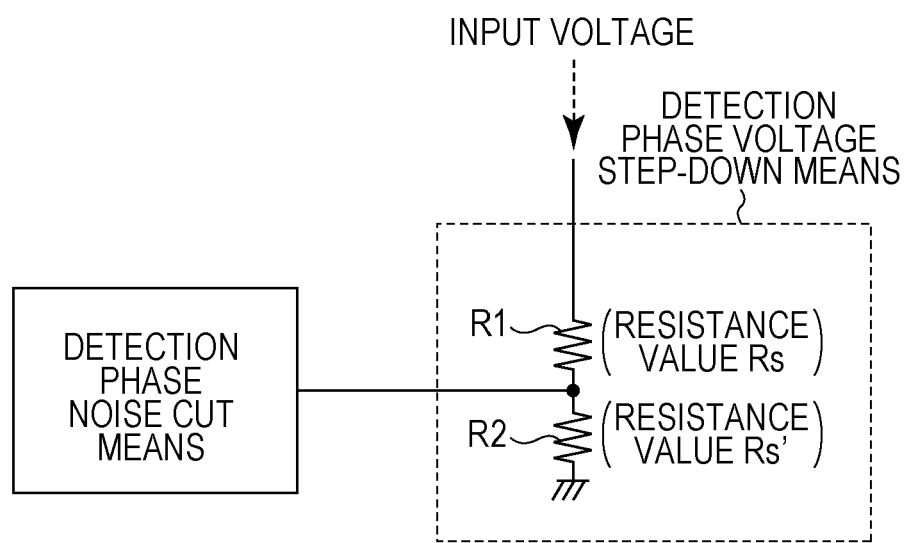
FIG. 5 is a schematic view of the circuit arrangement of a detection phase voltage step-down means for use in the oscillatory wave drive device of the present invention.

FIG. 5 is a schematic view of the circuit arrangement of the detection phase voltage step-down means in the oscillatory wave drive device of the present invention illustrated in FIG. 1. Among resistors of the detection phase voltage step-down means, a resistor having a resistance value Rs disposed in series to the detection phase noise cut means and a resistor having a resistance value Rs' disposed in parallel to the detection phase noise cut means suitably satisfy the relationship of $0.90 \leq Rs'/Rs \leq 1.10$.

Figure 6A:
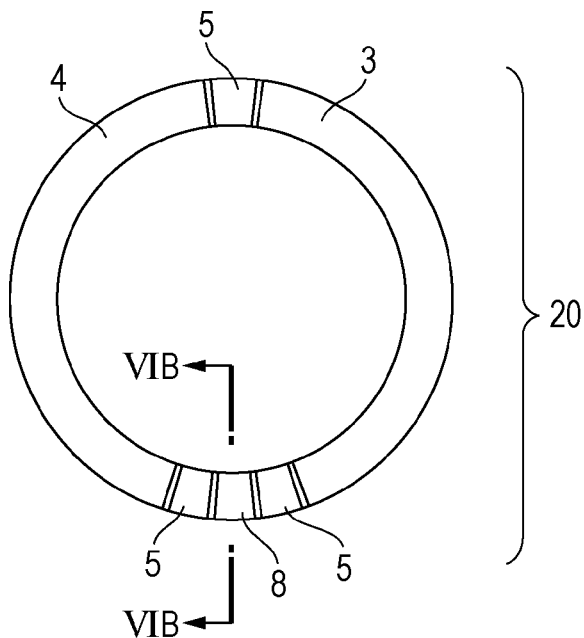
FIGS. 6A to 6C are schematic views illustrating an embodiment of a piezoelectric element for use in the oscillatory wave drive device of the present invention.
Figure 6B:
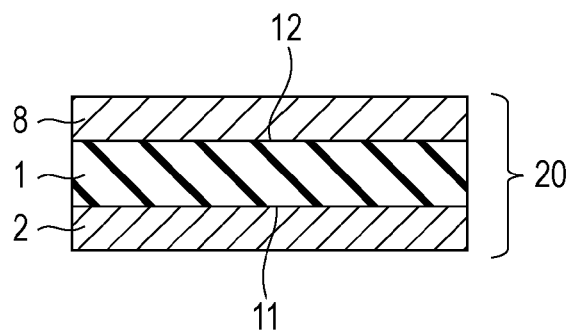
Figure 6C:
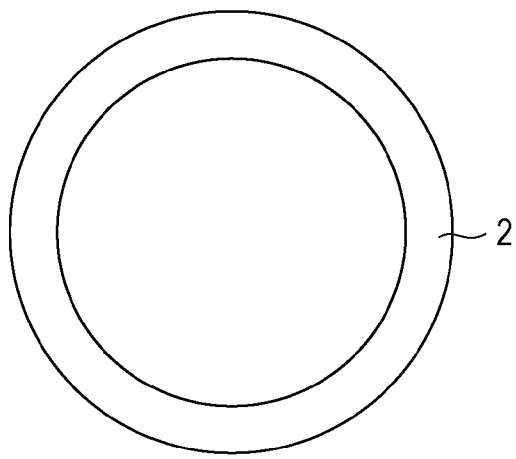

When the ratio is expressed by the voltage dividing ratio, the ratio is a voltage dividing ratio lower than 11/21 (1/1.91) and higher than 9/19 (1/2.11). In this ration, the variation of the voltage dividing ratio can be reduced and the influence of the noise component is also low, and thus the region is more suitable. Furthermore, resistors having the same resistance value standard can be used in the case of $0.90 \leq Rs'/Rs \leq 1.10$, the influence of the noise component is much lower, and the cost in mass production decreases. $Rs'/Rs = 1.00$ is more suitable. Electromechanical energy conversion element FIG. 6 is a schematic view showing one embodiment of an electromechanical energy conversion element (hereinafter referred to as a piezoelectric element) 20 of the oscillatory wave driving means of the present invention. FIG. 6A is a schematic plan view of one surface of the piezoelectric element 20 of the present invention. FIG. 6B is a cross sectional view of the piezoelectric element 20 at a position on the VIB-VIB line in FIG. 6A. FIG. 6C is a schematic plan view of the other surface opposite to FIG. 6A of the piezoelectric element 20 of the present invention with a piezoelectric material 1 interposed therebetween.

In FIGS. 6A and 6B, the piezoelectric element 20 for use in the present invention has, for example, one piece of an annular-shaped piezoelectric material 1 having an approximately uniform thickness of 0.1 to 2.0 mm, a common electrode 2 (ground electrode) provided on a first surface 11 of the piezoelectric material with the piezoelectric material 1 interposed therebetween, drive phase electrodes 3 and 4 provided on a second surface 12 of the piezoelectric material, a detection phase electrode 8, and non-drive phase electrodes 5. The drive phase electrodes 3 and 4 are the drive phase electrode 3 provided on a first drive phase (which is referred to as an A phase) and the drive phase electrode 4 provided on a second drive phase (B phase), respectively. Between each drive phase electrode, one or more interval portions of odd number times of $\lambda/4$ are provided. In the interval portions, the detection phase electrode or the non-drive phase electrode is provided. The detection phase electrode 8 is a detection phase electrode provided on the detection phase. The non-drive phase electrodes 5 are non-drive phase electrodes provided on non-drive phases which do not cause spontaneous piezoelectric oscillation. The detection phase is a portion sandwiched by the common electrode 2 and the detection phase electrode 8. The non-drive phase is a portion sandwiched by the common electrode 2 and the non-drive phase electrodes 5. As illustrated in FIG. 6C, the common electrode 2 is disposed in an annular shape.

The piezoelectric materials of the drive phases of the A phase and the B phase are subjected to polarization treatment by applying electric fields alternately in opposite directions at a $\lambda/2$ pitch. Therefore, the polarity of expansion and contraction of the piezoelectric material to the electric fields in the same direction are opposite to each other at each $\lambda/2$ pitch. The drive phase electrodes of the A phase and the B phase are provided at intervals of odd number times of $\lambda/4$. The polarity of expansion and contraction indicate the marks (+, −) of stress and distortion in an in-plane or out-of-plane direction of the piezoelectric materials to the direction of the electric fields.

The detection phase electrode 8 is provided at a place other than the drive phase electrodes on the second surface of the piezoelectric material 1 with a length other than a length of integral multiple of $\lambda$ in the circumferential direction, for example, and is provided with a length of $\lambda/4$, for example. The non-driving phase electrodes 5 are provided on places other than the drive phase electrodes and the detection phase electrode on the second surface of the piezoelectric material 1 and with a length of $\lambda/4$ in the circumferential direction, for example.

Herein, the one piece of piezoelectric material 1 of the present invention refers to a ceramic-like piezoelectric material having a uniform composition and having no joint produced by simultaneous firing of raw materials of the same composition. The ceramic generally contains a group of fine crystals, in which each crystal contains atoms having positive electric carriers and atoms having negative electric carriers. The ceramic has a state in which the positive electric carriers and the negative electric carriers are balanced in many cases. However, a dielectric ceramic is sometimes in a state where the positive and negative electric carriers in the crystals are not balanced even in the natural state and deviation (spontaneous polarization) of the electric carriers arises, which is referred to as a ferroelectric.

In the ferroelectric ceramic after firing, the spontaneous polarization directions are not uniform and deviation of electric carriers does not arise in appearance as the entire ceramic. However, when a high voltage is applied thereto, the spontaneous polarization directions become uniform and, even when the voltage is removed, the state does not return to the original state. Uniforming the spontaneous polarization directions as described above is generally referred to as polarization treatment. When a voltage is applied from the outside to the ferroelectric ceramic which has been subjected to the polarization treatment, the center of each of the positive and negative electric carriers inside the ceramic attracts or repels external electric carriers, so that the ceramic body expands and contracts (inverse piezoelectric effect). The one piece of piezoelectric material 1 of the present invention refers to a ceramic material which produces the inverse piezoelectric effect by performing the polarization treatment as described above and refers to a ceramic material in which at least one part of the one piece of piezoelectric material has been subjected to the polarization treatment.

Figure 7:
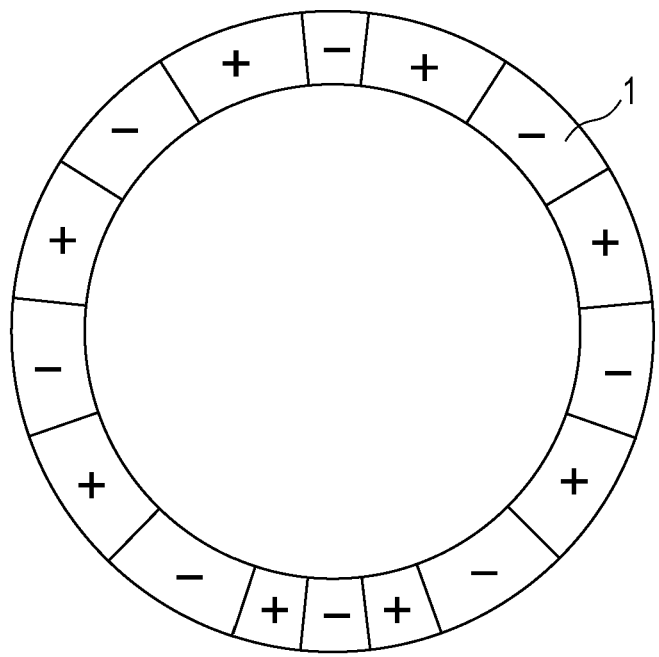
FIG. 7 is a schematic view showing polarity of expansion and contraction in the piezoelectric element for use in the oscillatory wave drive device of the present invention.

FIG. 7 is a schematic view showing polarity of expansion and contraction in the piezoelectric element 20 for use in the present invention. The polarity of expansion and contraction of the present invention distinguish whether the piezoelectric element 20 expands or contracts in the annular direction when a positive voltage is applied to the electrodes of the surface (the second surface of the piezoelectric element 20) illustrated in FIG. 6A of the piezoelectric element 20. In FIG. 7, the case where the piezoelectric element 20 expands in the annular direction is indicated by (+) and the case where the piezoelectric element 20 contracts in the annular direction is indicated by (−). The piezoelectric materials of the drive phases of the A phase and the B phase of the piezoelectric element 20 for use in the present invention illustrated in FIG. 6 have been subjected to the polarization treatment beforehand in such a manner that the directions are alternately opposite to each other at a $\lambda/2$ pitch along the annular direction. Therefore, when voltages in the same direction are applied to the piezoelectric materials of the drive phases of the A phase and the B phase, the piezoelectric materials of the drive phases of the A phase and the B phase can expand and contract to be opposite to each other at each $\lambda/2$ pitch along the annular direction due to the inverse piezoelectric effect. More specifically, as illustrated in FIG. 7, the piezoelectric materials of the drive phases of the A phase and the B phase have polarity of expansion and contraction which are opposite to each other at each $\lambda/2$ pitch.

The electrodes in the piezoelectric element 20 for use in the present invention are provided on either surface of the annular-shaped one piece of piezoelectric material 1 and are electric conductors having a resistance value of less than $10\Omega$ and suitably less than $1\Omega$. In the common electrode 2, for example, the resistance value of the electrode can be evaluated by measuring the resistance between a certain point in the circumferential direction of the annular shape, i.e., a certain point of the common electrode, and a certain point symmetrical to the center across the center of the ring with a circuit tester (electric tester). In the case of the drive phase electrode 3, for example, the resistance value of the electrode can be evaluated by measuring the resistance between the furthest points in the circumferential direction of the annular shape with a circuit tester (electric tester). Other electrodes can also be evaluated by the same method. As the electrodes of the present invention, a baked electrode containing an Ag paste or Ag, a sputtering electrode of Au/Ti, and the like are suitable because the electrodes are thin and have a low resistance.

The electrodes in the piezoelectric element 20 for use in the present invention may be a laminate of a plurality of electrodes insofar as there is a portion directly provided on either surface of the piezoelectric material 1. For example, the piezoelectric materials of the drive phases of the A phase and the B phase of the piezoelectric element 20 have been subjected to the polarization treatment in which the directions are alternately opposite to each other at $\lambda/2$ of pitches along the annular direction as described above. More specifically, the polarity of expansion and contraction of the piezoelectric element 20 vary as shown in FIG. 7. In order to perform such polarization treatment, it is suitable to provide a plurality of polarization electrodes are provided on one surface (for example, the second surface of the piezoelectric element 20 illustrated in FIG. 6A) of the piezoelectric material 1, provide the common electrode 2 on the other surface (for example, the first surface of the piezoelectric element 20 illustrated in FIG. 6C) of the piezoelectric material 1, and then perform the polarization treatment. The drive phase electrodes 3 and 4 of the A phase and the B phase can be provided by connecting the plurality of polarization electrodes with an individual electrode or laminating another electrode on the top of the plurality of polarization electrodes.

The power supply member to the piezoelectric element 20 for use in the present invention is suitably a flexible printed circuit board.

Figure 8:
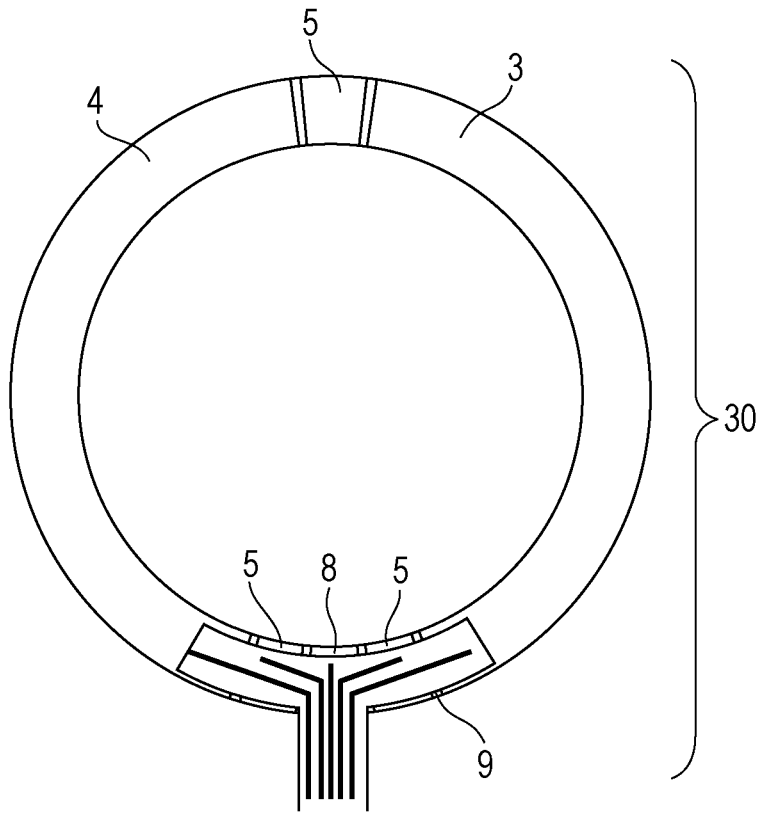
FIG. 8 is a schematic view showing one embodiment in which a power supply member is disposed in the piezoelectric element for use in the oscillatory wave drive device of the present invention.

FIG. 8 is a schematic view showing one embodiment in which the power supply member is disposed in the piezoelectric element 20 for use in the present invention.

In the piezoelectric element for use in the present invention illustrated in FIG. 6, a power supply member 9 is disposed on the surface of FIG. 6A of the piezoelectric element 20 and also disposed on a part of the drive phase electrodes 3 and 4, the non-drive phase electrode, and the detection phase electrode. The flexible printed circuit board also has high dimensional accuracy and positioning thereof is also easily achieved by the use of a jig or the like. Therefore, a quality reduction resulting from the variation of the oscillation performance of the oscillatory wave driving means caused by the position variation when connecting the power supply member 9 to the piezoelectric element 20 and the like can be suppressed.

For the connection of the flexible printed circuit board, thermocompression bonding using an epoxy adhesive or the like can also be used. However, suitably, by thermocompression bonding an anisotropic conductive paste (ACP) or an anisotropic conductive film (ACF) having electroconductivity, poor electrical connection decreases and the process speed increases, and thus the thermocompression bonding is suitable in terms of mass production properties.

Depolarization Temperature of Piezoelectric Element

The piezoelectric element 20 for use in the oscillatory wave drive device of the present invention has the one piece of piezoelectric material 1, the common electrode 2 provided on the first surface of the piezoelectric material 1 with the piezoelectric material 1 interposed therebetween, and the plurality of electrodes provided on the second surface of the piezoelectric material 1. The depolarization temperature Td of the one piece of piezoelectric material 1 is suitably 80° C. or higher and 160° C. or less.

When the depolarization temperature Td is 80° C. or higher and 160° C. or less, depolarization occur in a part of the piezoelectric material 1 in the detection phase electrode when performing thermocompression bonding an anisotropic conductive paste (ACP) or an anisotropic conductive film (ACF) which is suitable in terms of mass production properties in the process of connecting the flexible printed circuit board. An electric signal to be output from the detection phase electrode becomes low due to the partial depolarization, and therefore the voltage dividing ratio for use in the detection phase voltage step-down means can be increased. As a result, it can be expected to reduce the variation of the detection phase voltage step-down means.

When the depolarization temperature Td is less than 80° C., the piezoelectric material 1 in the detection phase electrode is depolarized when thermocompression bonding an anisotropic conductive paste (ACP) or an anisotropic conductive film (ACF) which is suitable in terms of mass production properties in the process of connecting the flexible printed circuit board, so that there is a possibility that the voltage value to be output from the detection phase when driving the motor becomes excessively low, and thus the detection by the phase difference detecting means cannot be achieved. On the other hand, when the depolarization temperature Td is higher than 160° C., the temperature required for partially depolarizing a part of the piezoelectric material 1 becomes high, which may influence peripheral members, and thus such a temperature is not suitable. The depolarization temperature Td of the piezoelectric material 1 is more suitably 95° C. or higher and 160° C. or less.

When the piezoelectric material 1 is not subjected to the polarization treatment, the piezoelectric effect is not produced. When the polarization treatment is insufficient, the piezoelectric effect becomes lower than that in the case where the polarization treatment is sufficiently performed. When the piezoelectric material is heat-treated at a temperature equal to or higher than the Curie temperature (Tc) of the piezoelectric material or a temperature equal to or higher than the depolarization temperature (Td), the piezoelectric effect decreases. Even when the temperature is equal to or less than the Curie temperature or equal to or less than the depolarization temperature, a reduction in the piezoelectric effect is sometimes observed as compared with the case where the piezoelectric material is not heat-treated when the heat treatment is performed at a temperature around the temperatures. Thus, even when the completely same piezoelectric material is used, the degree of the piezoelectric effect of the piezoelectric material varies depending on the polarization treatment conditions, the heat-treatment conditions, and the like. Even in the case of the one piece of piezoelectric material, the degree of the piezoelectric effect of the piezoelectric material partially varies by performing treatment, such as heat treatment, of only a part of the piezoelectric material at a temperature equal to or higher than the Curie temperature or a temperature equal to or higher than the depolarization temperature. The piezoelectric constant of the piezoelectric material of the present invention refers to the piezoelectric constant of one part of such one piece of piezoelectric material.

In the present invention, the Curie temperature (Tc) refers to a temperature at which the ferroelectricity of the piezoelectric material 1 disappears. Methods for specifying the Curie temperature include a method including directly measuring the temperature at which the ferroelectricity of the piezoelectric material disappears and a method including measuring the dielectric constant of the piezoelectric material using a small AC electric field, and then determining the Curie temperature from a temperature at which the dielectric constant reaches the maximum. In the present invention, the depolarization temperature (Td) refers to a temperature at which the inverse piezoelectric effect of the piezoelectric material 1 remarkably decreases. Methods for specifying the depolarization temperature include a method including first measuring the piezoelectric constant at room temperature of the piezoelectric material after sufficient time has passed after the polarization treatment, heating the piezoelectric material from room temperature to a certain temperature (for example, Td), and then measuring the piezoelectric constant at room temperature again. In the present invention, the temperature at which the piezoelectric constant after the heating is 95% or less of the piezoelectric constant before heating is defined as the depolarization temperature Td.

When the thermocompression bonding is used for the connection of the flexible printed circuit board 8, by selecting a piezoelectric material in such a manner that the Curie temperature or the depolarization temperature of the piezoelectric material 1 is almost equal to or less than the thermocompression bonding temperature, a low piezoelectric effect is exhibited even when a portion where the detection phase electrode 8 is disposed of the piezoelectric element 20 has been subjected to the polarization treatment beforehand. Due to the low piezoelectric effect, the value of the voltage to be output from the detection phase becomes low, which makes it possible to reduce the voltage dividing ratio of the voltage step-down means provided before the phase difference detecting means, so that a variation of the voltage dividing ratio in the voltage step-down means can be reduced.

Piezoelectric Constant of Piezoelectric Element

In the piezoelectric element 20 for use in the oscillatory wave drive device of the present invention, the plurality of electrodes provided on the second surface have at least the plurality of drive phase electrodes, the detection phase electrode 8, and the non-drive phase electrodes 5, and it is suitable for the relationship between an absolute value d(1) of the piezoelectric constant of a piezoelectric material (1) (hereinafter referred to as d(1)) of a portion sandwiched by the plurality of drive phase electrodes and the common electrode 2 and an absolute value d(2) of the piezoelectric constant of a piezoelectric material (2) (hereinafter referred to as d(2)) of a portion sandwiched by the detection phase electrode 8 and the common electrode 2 to satisfy d(1)>d(2).

Herein, the portion sandwiched by the detection phase electrode 8 and the common electrode 2 refers to a region where the line vertical to the two electrode surfaces of the detection phase electrode 8 and the common electrode 2 and the piezoelectric material cross to each other. However, when the detection phase electrode 8 and the common electrode 2 are not parallel to each other, the portion refers to a region where the line vertical to the two electrode surfaces of the detection phase electrode 8 and the surface on which the detection phase electrode 8 is projected to the common electrode 2 and the piezoelectric material cross to each other. The same applies to the following description of "the sandwiched portion". The same also applies to a portion sandwiched by the non-drive phase electrodes 5 and the common electrode 2 and a portion sandwiched by the drive phase electrodes 3 and 4 and the common electrode 2.

A method for evaluating the absolute value d(1) of the piezoelectric constant of the present invention and the absolute value d(2) of the piezoelectric constant is as follows. The piezoelectric element 20 is separated from the power supply member 9. Then, a desired portion of the piezoelectric element 20 is cut out, and then evaluated by a Berlincourt method. Specifically, when the absolute value d(1) of the piezoelectric constant is evaluated, it is suitable to cut out one part where the drive phase electrodes are disposed or when the absolute value d(2) of the piezoelectric constant is evaluated, it is suitable to cut out one part where the detection phase electrode is disposed in such a manner as to have an area comparable to the area of the part where the drive phase electrodes are disposed, and then evaluate each one part by a Berlincourt method.

The piezoelectric constant which can be evaluated by a Berlincourt method is a $d_{33}$ constant due to the positive piezoelectric effect. In general, in the case of an annular-shaped oscillatory wave motor utilizing bending oscillation, the piezoelectric constant d refers to a distortion amount (inverse piezoelectric effect) produced to a surface vertical to an electric field when a unit electric field is given between the electrodes and is suitably evaluated by the piezoelectric constant d by a $d_{31}$ or $d_{32}$ constant. However, in the present invention, the absolute value d(1) of the piezoelectric constant and the absolute value d(2) of the piezoelectric constant may be able to be compared. Therefore, the piezoelectric constants can be compared by evaluating the absolute value of the $d_{33}$ constant by the above-described method.

Due to the fact that the absolute value d(2) of the piezoelectric constant of the piezoelectric material (2) is lower than the absolute value d(1) of the piezoelectric constant of the piezoelectric material (1), when the piezoelectric element 20 is driven, the voltage value to be output from the detection phase electrode can be made lower than the voltage value input into the drive phase electrodes. Therefore, the voltage dividing ratio of the resistance voltage dividing circuit for use in the detection phase voltage step-down means can be reduced, so that a variation of the detection phase voltages due to the voltage dividing ratio in the voltage step-down means can be suppressed.

It is more suitable in the piezoelectric element 20 for use in the oscillatory wave drive device of the present invention that the relationship among the d(1), d(2), and an absolute value d(3) of the piezoelectric constant of the piezoelectric material (hereinafter also referred to as d(3)) of a portion sandwiched by the non-drive phase electrodes 5 and the common electrode 2 satisfies d(1)>d(3)≥d(2).

A method for evaluating the absolute value d(3) of the piezoelectric constant of the present invention is the same as the method for evaluating the absolute value d(1) of the piezoelectric constant and the absolute value d(2) of the piezoelectric constant. Specifically, when evaluating the absolute value d(3) of the piezoelectric constant, it is suitable to cut out one part where the non-drive phase electrodes 5 are disposed in such a manner as to have an area comparable to the area of one part where the drive phase electrodes are disposed, and then evaluate the absolute value d(3) by a Berlincourt method.

By reducing the absolute value of the piezoelectric constant d(3) to be smaller than the absolute value of the piezoelectric constant d(1), oscillation excited from the piezoelectric material of a portion having the piezoelectric constant of d(3) when the piezoelectric element 20 is driven decreases. Therefore, the influence of the other oscillation modes can be reduced, so that a variation of the voltages to be output from the detection phase electrode can be further reduced.

Piezoelectric Material

The piezoelectric material 1 of the piezoelectric element 20 for use in the oscillatory wave drive device of the present invention is not particularly limited. For example, piezoelectric ceramic, such as lead zirconate titanate (PZT), barium titanate, barium titanate calcium, bismuth sodium titanate, lead titanate, lithium niobate, sodium potassium niobate, and bismuth ferrite, piezoelectric ceramic containing the same as the main component, and the like can be used.

In the piezoelectric material 1 of the piezoelectric element 20 for use in the oscillatory wave drive device of the present invention, the lead content is more suitably less than 1000 ppm. In a former piezoelectric element 20, the piezoelectric material is almost piezoelectric ceramic containing lead zirconate titanate as the main component. Therefore, it is pointed out that when the piezoelectric element is discarded to be exposed to acid rain or is left in a severe environment, for example, there is a possibility that the lead component in the piezoelectric material is melted into the soil to damage the ecosystem. However, when the lead content is less than 1000 ppm, even when the piezoelectric element is discarded to be exposed to acid rain or is left in a severe environment, for example, the possibility that the lead component in the piezoelectric material 1 adversely affects the ecosystem is low.

The lead content of the piezoelectric material 1 can be evaluated based on the lead content based on the total weight of the piezoelectric material 1 quantified by X-ray fluorescence spectroscopy (XRF) or ICP atomic emission spectrophotometry, for example.

The piezoelectric material 1 of the present invention is more suitably a piezoelectric ceramic containing barium titanate as the main component among piezoelectric materials not containing lead. In the piezoelectric ceramic containing barium titanate as the main component among various kinds of piezoelectric ceramic not containing lead, the absolute value d of the piezoelectric constant is large. Accordingly, a voltage required for obtaining the same distortion amount can be made low. Therefore, the piezoelectric material 1 of the present invention is more suitably the piezoelectric ceramic containing barium titanate as the main component also considering the environment.

It is suitable for the piezoelectric material 1 to contain, as the main component, a perovskite type metal oxide represented by the following general formula (1),

$(Ba_{1-x}Ca_x)_b(Ti_{1-y}Zr_y)O_3$ (1).

($1.00 < b \leq 1.02$, $0.020 \leq x \leq 0.300$, $0.020 \leq y \leq 0.095$), in which Mn is contained in the metal oxide and the content of the Mn is 0.02 part by weight or more and 0.40 part by weight or less in terms of metal based on 100 parts by weight of the metal oxide.

In the present invention, the perovskite type metal oxide refers to a metal oxide having a perovskite structure having a cubic structure as an ideal structure which is described in Iwanami Physics-and-Chemistry Dictionary, 5th edition (published by Iwanami Shoten, Feb. 20, 1998). The metal oxide having the perovskite structure is generally expressed by a chemical formula of $ABO_3$. In the perovskite type metal oxide, the elements A and B occupy specific positions of a unit lattice, referred to as an A site and a B site in the form of ion, respectively. For example, in the case of a cubic unit lattice, the A element is located at the apex of the cube and the B element is located at the body center of the cube. The O elements occupy the face center of the cube as a negatives ion of oxygen.

In the metal oxide represented by the general formula (1), the metallic elements located in the A site are Ba and Ca and the metallic elements located in the B site are Ti and Zr. However, a part of Ba and Ca may be located in the B site. Similarly, a part of Ti and Zr may be located in the A site.

The molar ratio of the elements in the B site to the O elements in General Formula (1) is 1 to 3. However, even when the molar ratio slightly deviates from the ratio mentioned above, the deviated molar ratio is included in the scope of the present invention insofar as the metal oxide contains the perovskite structure as the main phase.

It can be judged that that the metal oxide has the perovskite structure from the structural analysis by X ray diffraction or electron beam diffraction, for example.

In General Formula (1), x showing the molar ratio of Ca in the A site is in the range of $0.020 \leq x \leq 0.300$. When x is smaller than 0.020, there is a possibility that dielectric loss (tan δ) increases. When the dielectric loss increases, heat generation occurring when the piezoelectric element 20 is driven by applying a voltage increases, and therefore there is a possibility that the drive efficiency decreases. On the other hand, when x is larger than 0.300, there is a possibility that the piezoelectric characteristics are not sufficient.

In General Formula (1), y showing the molar ratio of Zr in the B site is in the range of $0.020 \leq y \leq 0.095$. When y is smaller than 0.020, there is a possibility that the piezoelectric characteristics are not sufficient. On the other hand, when y is larger than 0.095, the depolarization temperature (Td) is as low as less than 80° C., and therefore there is a possibility that the inverse piezoelectric effect of the piezoelectric material 1 disappears at high temperatures.

In General Formula (1), b showing the ratio of the molar quantity of Ba and Ca in the A site to the molar quantity of Ti and Zr in the B site is suitably in the range of $1.00 < b \leq 1.02$. When b is 1.00 or less, unusual particle growth is likely to occur, so that there is a possibility that the mechanical strength of the piezoelectric material 1 decreases. On the other hand, when b is larger than 1.02, there is a possibility that the temperature required for particle growth becomes excessively high, so that the density does not become sufficiently large in a general firing furnace or a large number of pores and lattice defects are present in the piezoelectric material 1.

A means for measuring the composition of the piezoelectric material 1 is not particularly limited. The means includes X-ray fluorescence spectroscopy, ICP atomic emission spectrophotometry, atomic absorption analysis, and the like. In any means, the weight ratio and the composition ratio of each element contained in the piezoelectric material 1 can be calculated.

It is suitable that the piezoelectric material 1 contains the perovskite type metal oxide represented by General Formula (1) above as the main component, that Mn is contained in the metal oxide, and that the content of the Mn is 0.02 part by weight or more and 0.40 part by weight or less in terms of metal based on 100 parts by weight of the metal oxide.

When Mn is contained in the content range mentioned above, the insulation properties and the mechanical quality factor Qm increase. Herein, the mechanical quality factor Qm is a factor showing elasticity loss due to oscillation when the piezoelectric element is evaluated as a vibrator and the degree of the mechanical quality factor is observed as the sharpness of the resonance curve in impedance measurement. More specifically, the mechanical quality factor Qm is a constant showing the sharpness of the resonance of the piezoelectric element. When the mechanical quality factor Qm is large, the distortion amount of the piezoelectric element becomes larger near the resonance frequency, and thus the piezoelectric element can be effectively oscillated.

The improvement of the insulation properties and the mechanical quality factor is considered to result from the generation of an internal electric field due to the introduction of a defective dipole by Mn different in valence from the valence of Ti and Zr. When the internal electric field is present, the reliability of the piezoelectric element 20 can be secured when applying a voltage to the piezoelectric element 20 for driving.

Herein, the content "in terms of metal" showing the Mn content represents a value determined based on the ratio of the Mn weight to the case where the contents of elements constituting the metal oxide represented by General Formula (1) are determined in terms of oxide from the content of each of metals of Ba, Ca, Ti, Zr, and Mn measured by X-ray fluorescence spectroscopy (XRF), ICP atomic emission spectrophotometry, atomic absorption analysis, and the like from the piezoelectric material 1, and then the total weight thereof is adjusted to 100.

When the Mn content is less than 0.02 part by weight, there is a possibility that the effect of the polarization treatment required for the drive of the piezoelectric element 20 is not sufficient. On the other hand, when the Mn content is higher than 0.40 part by weight, there is a possibility that the piezoelectric characteristics are not sufficient and a crystal of a hexagonal structure which does not contribute to the piezoelectric characteristics is developed.

Mn is not limited to metal Mn and may be contained in a piezoelectric material as a Mn component, and the manner of containing Mn is not limited. For example, Mn may form a solid solution in the B site or may be contained in the grain boundary. Alternatively, a Mn component may be contained in the form of metal, ion, oxide, metal salt, complex, or the like in the piezoelectric material 1. As a more suitable containing manner, Mn forms a solid solution in the B site from the viewpoint of insulation properties or ease of sintering. In the case where Mn form a solid solution in the B site, when the ratio of the molar quantity of Ba and Ca in the A site to the molar quantity of Ti, Zr, and Mn in the B site is defined as A2/B2, a suitable A2/B2 range is $0.993 \leq A2/B2 \leq 0.998$.

The piezoelectric material 1 may contain Bi in a proportion of 0.042 part by weight or more and 0.850 part by weight or less in terms of metal based on 100 parts by weight of the metal oxide represented by General Formula (1). The content of Bi based on the metal oxide can be measured by, for example, ICP-MS composition analysis. Bi may be in the grain boundary of the ceramic-like piezoelectric material or may form a solid solution in the perovskite type structure of $(Ba,Ca)(Ti,Zr)O_3$. When Bi is present in the grain boundary, friction between particles is reduced, so that the mechanical quality factor increases. On the other hand, when Bi is taken into the solid solution forming the perovskite structure, the phase transition temperature decreases, so that the temperature dependency of the piezoelectric constant becomes low, which results in a further increase in the mechanical quality factor. When the position of Bi taken into the solid solution is the A site, the charge balance with the Mn is good, and thus the position is suitable.

The piezoelectric material 1 may contain components other than the oxide represented by General Formula (1) above and Mn (hereinafter referred to as accessory components) in the range where the characteristics do not vary. The total content of the accessory components is suitably less than 1.2 parts by weight based on 100 parts by weight of the metal oxide represented by General Formula (1). When the content of the accessory components exceeds 1.2 parts by weight, there is a possibility that the piezoelectric characteristics and the insulation properties of the piezoelectric material 1 decrease. The content of metallic elements other than Ba, Ca, Ti, Zr, and Mn among the accessory components is suitably 1.0 part by weight or less in terms of oxide or 0.9 part by weight or less in terms of metal based on the piezoelectric material 1. The metallic elements of the present invention also include semimetallic elements, such as Si, Ge, and Sb. When the content of metallic elements other than Ba, Ca, Ti, Zr, and Mn among the accessory components exceeds 1.0 part by weight in terms of oxide and exceeds 0.9 part by weight in terms of metal based on the piezoelectric material 1, there is a possibility that the piezoelectric characteristics and the insulation properties of the piezoelectric material 1 remarkably decrease. The total content of Li, Na, Mg, and Al elements among the accessory components is suitably 0.5 part by weight or less in terms of metal based on the piezoelectric material 1. When the total content of Li, Na, Mg, and Al elements among the accessory components exceeds 0.5 part by weight in terms of metal based on the piezoelectric material 1, there is a possibility that sintering becomes insufficient. The total content of Y and V elements among the accessory components is suitably 0.2 part by weight or less in terms of metal based on the piezoelectric material 1. When the total content of Y and V elements among the accessory components exceeds 0.2 part by weight in terms of metal based on the piezoelectric material 1, there is a possibility that the polarization treatment becomes difficult to perform.

Examples of the accessory components include sintering aids, such as Si, Cu, and B. Sr and Mg which are contained as inevitable components in commercially-available materials of Ba and Ca may be contained in the piezoelectric material of the present invention. Similarly, Nb contained as inevitable components in commercially-available materials of Ti and Hf contained as inevitable components in commercially-available materials of Zr may be contained in the piezoelectric material 1 of the present invention.

A means for measuring the part(s) by weight of the accessory components is not particularly limited. The means includes X-ray fluorescence spectroscopy (XRF), ICP atomic emission spectrophotometry, atomic absorption analysis, and the like.

Optical Apparatus

Next, an optical apparatus of the present invention is described. The optical apparatus of the present invention has a feature of having the above-described oscillatory wave drive device.

Figure 9A:
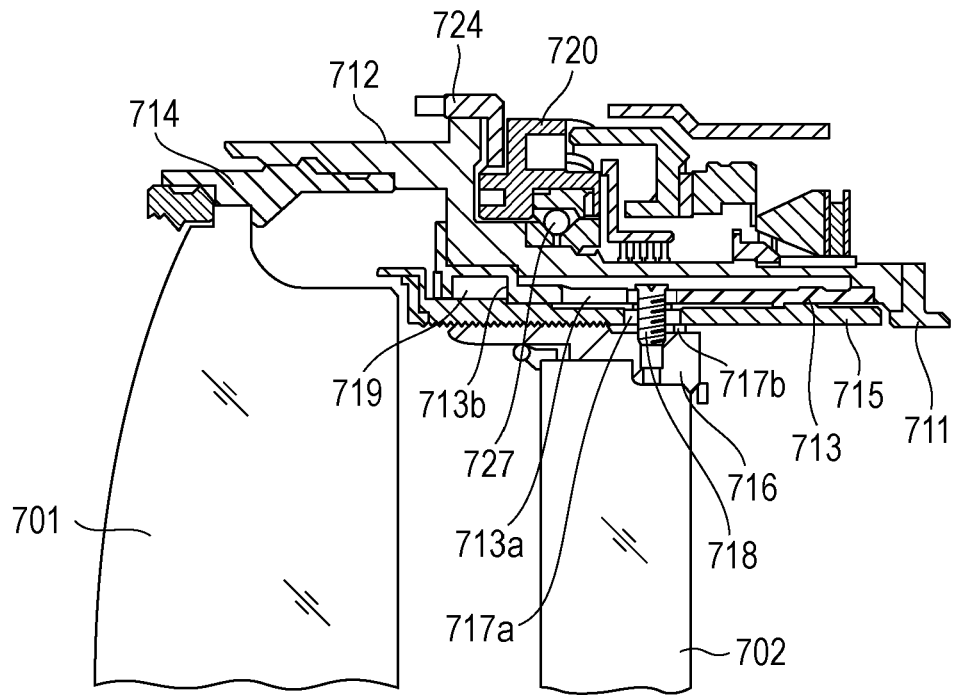
FIGS. 9A and 9B are schematic views showing one embodiment of an optical apparatus of the present invention.
Figure 9B:
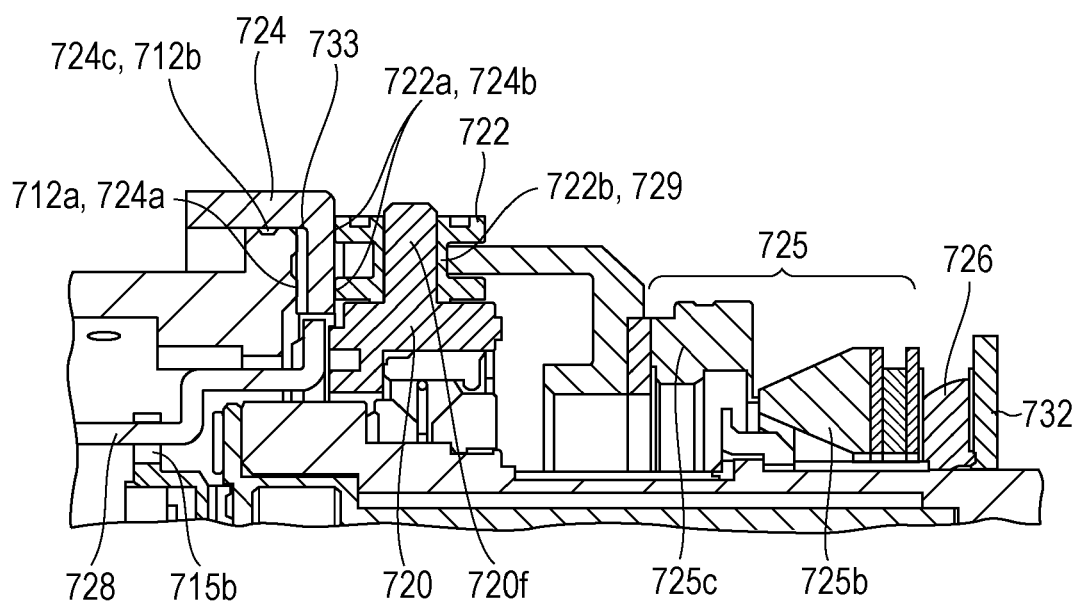

FIG. 9 is a main cross sectional view of an interchangeable lens body tube of a single lens reflex camera which is an example of a suitable embodiment of the optical apparatus of the present invention. FIG. 10 is an exploded perspective view of the interchangeable lens body tube of the single lens reflex camera which is an example of a suitable embodiment of the optical apparatus of the present invention. To an attachment-and-detachment mount 711 with the camera, a fixed tube 712, a straight advance guiding tube 713, and a front group body tube 714 are fixed.

The straight advance guiding tube 713 is provided with a straight advance guiding groove 713a in the optical axis direction for a focusing lens 702. To a rear group body tube 716 holding the focusing lens 702, cam rollers 717a and 717b projecting outward in the radial direction are fixed with a shaft screw 718, and the cam roller 717a is fitted in the straight advance guiding groove 713a.

A cam ring 715 is rotatably fitted in the inner circumference of the straight advance guiding tube 713. The straight advance guiding tube 713 and the cam ring 715 are limited in relative movement in the optical axis direction due to the fitting of the roller 719 fixed to the cam ring 715 in a circumferential groove 713b of the straight advance guiding tube 713. The cam ring 715 is provided with a cam groove 715a for the focusing lens 702. The cam roller 717b described above is simultaneously fitted in the cam groove 715a.

On the outer peripheral side of the fixed tube 712, a rotation transmission ring 720 held by a ball race 727 in such a manner that the fixed position can be rotated to the fixed tube 712 is disposed. In the rotation transmission ring 720, a roller 722 is rotatably held on a shaft 720f radially extending from the rotation transmission ring 720. A large diameter portion 722a of the roller 722 contacts a mount side end face 724b of a manual focus ring 724. A small diameter portion 722b of the roller 722 contacts a joint member 729. Six rollers 722 are disposed at regular intervals on the periphery of the rotation transmission ring 720, and each roller is constituted according to the above-described relationship.

A low friction sheet (washer member) 733 is disposed in the bore diameter portion of the manual focus ring 724. The low friction sheet is sandwiched between a mount side end face 712a of the fixed tube 712 and a front side end face 724a of the manual focus ring 724. The outer diameter surface of the low friction sheet 733 has a ring shape and is diameter-fitted in a bore diameter 724c of the manual focus ring 724. Further, the bore diameter 724c of the manual focus ring 724 is diameter-fitted in an outer diameter portion 712b of the fixed tube 712. The low friction sheet 733 has a function of reducing friction in the rotation ring mechanism having a configuration in that the manual focus ring 724 relatively rotates to the fixed tube 712 around the optical axis.

The large diameter portion 722a of the roller 722 and the mount side end face 724b of the manual focus ring contact under pressure caused by power in which the wave washer 726 presses an ultrasonic motor 725, which is the oscillatory wave motor, to the front of the lens. Similarly, by the power in which a wave washer 726 presses the ultrasonic motor 725 to the front of the lens, the small diameter portion 722b of the roller 722 and the joint member 729 contact under moderate pressure. The wave washer 726 is limited in the movement in the mount direction by a washer 732 which is bayonet-connected to the fixed tube 712. The spring power (energization power) generated by the wave washer 726 is transmitted to the ultrasonic motor 725 and also the rollers 722, and the manual focus ring 724 generates power of pressing the mount side end face 712a of the fixed tube 712. More specifically, the manual focus ring 724 is installed in the state where the manual focus ring 724 is pressed against the mount side end face 712a of the fixed tube 712 through the low friction sheet 733.

Accordingly, when the ultrasonic motor 725 is rotated and driven to the fixed tube 712 by a control unit (not illustrated), the rollers 722 rotate around the center of the shaft 720f because the joint member 729 frictionally contacts the small diameter portion 722b of the roller 722. When the rollers 722 rotate around the shaft 720f, the rotation transmission ring 720 consequently rotates around the optical axis (autofocus operation).

When the rotating power around the optical axis is given to a manual focus ring 724 from the manual operation input section (not illustrated), the rollers 722 rotate around the shaft 720f by the frictional power because the mount side end face 724b of the manual focus ring 724 frictionally contacts the large diameter portion 722a of the rollers 722. When the large diameter portion 722a of the roller 722 rotates around the shaft 720f, the rotation transmission ring 720 rotates around the optical axis. During the operation, the ultrasonic motor 725 does not rotate due to the friction holding power of a rotor 725c and a stator 725b (manual focus operation).

To the rotation transmission ring 720, two focus keys 728 are attached to positions facing each other. The focus keys 728 are fitted in a notch portion 715b at the leading edge of the cam ring 715. Therefore, when the autofocus operation or the manual focus operation is performed, so that the rotation transmission ring 720 is rotated around the optical axis, the rotating power is transmitted to the cam ring 715 through the focus keys 728. When the cam ring is rotated around the optical axis, the back rear group body tube 716 whose rotation is limited by the cam roller 717a and the straight advance guiding groove 713a moves back and forth by the cam roller 717b along the cam groove 715a of the cam ring 715. Thus, the focusing lens 702 is driven, whereby the focusing operation is performed.

Herein, although the interchangeable lens body tube of the single lens reflex camera is described as the optical apparatus of the present invention, the present invention can be applied to optical apparatus having an oscillatory wave drive device irrespective of the type of cameras, such as a compact camera and an electronic still camera.

EXAMPLES

Next, the oscillatory wave drive device and the optical apparatus of the present invention are specifically described with reference to Examples but the present invention is not limited to Examples described below. Examples are described using reference numerals in the drawings with reference to the drawings.

Example 1

Figure 11A:
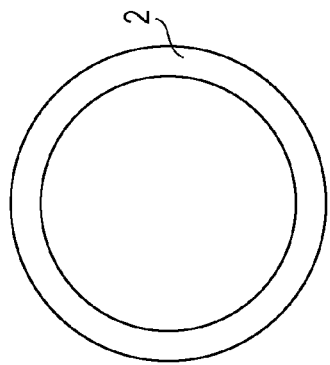
FIGS. 11A to 11E show a schematic process chart showing an example of a method for manufacturing a stator for an oscillatory wave motor of the oscillatory wave drive device of the present invention.

As a piezoelectric material 1, an annular-shaped piezoelectric material 1 illustrated in FIG. 11A was produced using a commercially-available lead zirconate titanate (PZT). The Curie temperature of the lead zirconate titanate (PZT) is 310° C.

Figure 11B:
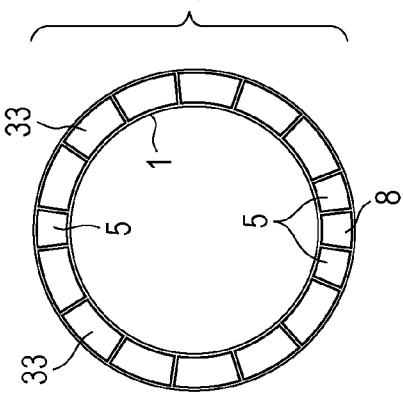
Figure 11C:
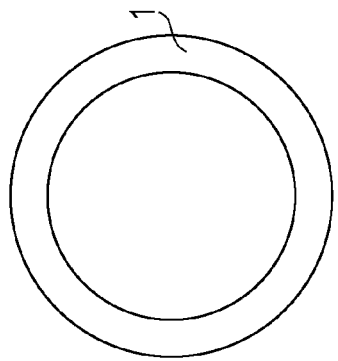

Next, on the annular-shaped piezoelectric material 1, the common electrode 2 was formed on one surface as illustrated in FIG. 11C and polarization electrodes 33, the non-drive phase electrodes (ground electrodes) 5, and the detection phase electrode 8 were formed on the other surface as illustrated in FIG. 11B by screen printing of a silver paste. In this process, the interelectrode distance of the adjacent electrodes illustrated in FIG. 11B was set to 0.5 mm.

Next, polarization treatment was performed between the common electrode 2, the polarization electrodes 33, the ground electrodes 5, and the detection phase electrode 8 using a direct-current power supply in such a manner that the polarity of expansion and contraction of a piezoelectric element are as shown in FIG. 7. The voltage was set to a degree at which a 0.6 kV/mm electric field was applied and the temperature and the voltage application time were set to 220° C. and 30 minutes, respectively.

Figure 11D:
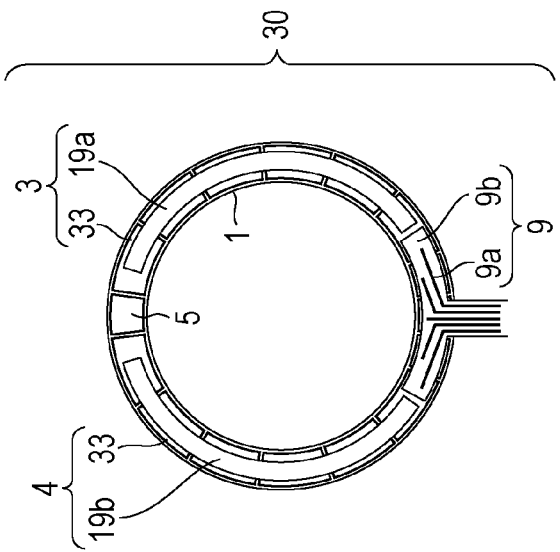

Next, in order to connect the polarization electrodes 33, connection electrodes 19a and 19b were formed with a silver paste to obtain the piezoelectric element 20 as illustrated in FIG. 11D. The silver paste was dried at a temperature sufficiently lower than the Curie temperature of the piezoelectric material 1. Herein, the resistance value of the drive phase electrodes 3 was measured with a circuit tester (electric tester). One side of the tester was brought into contact with the top of the polarization electrode 33 closest to the detection phase electrode 8 and the other side was brought into contact with the top of the farthest polarization electrode 33 in the circumferential direction of the annular shape of the drive phase electrodes 3. As a result, the resistance value of the electrode was 0.6Ω.

Figure 11E:
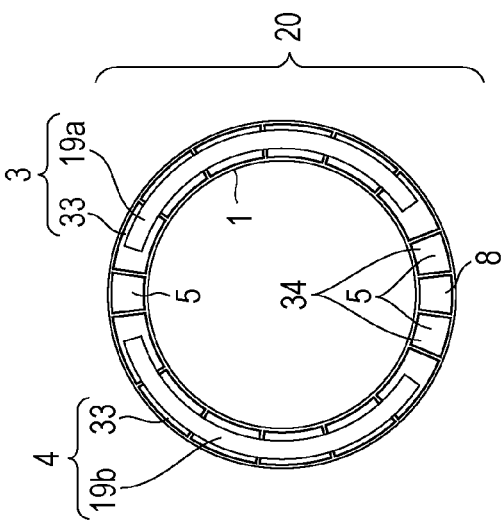

Next, as illustrated in FIG. 11E, the flexible printed circuit board 9 was stuck to the piezoelectric element 20 under pressure at room temperature using an epoxy adhesive to produce a piezoelectric element 30 with a power supply member.

Figure 12A:
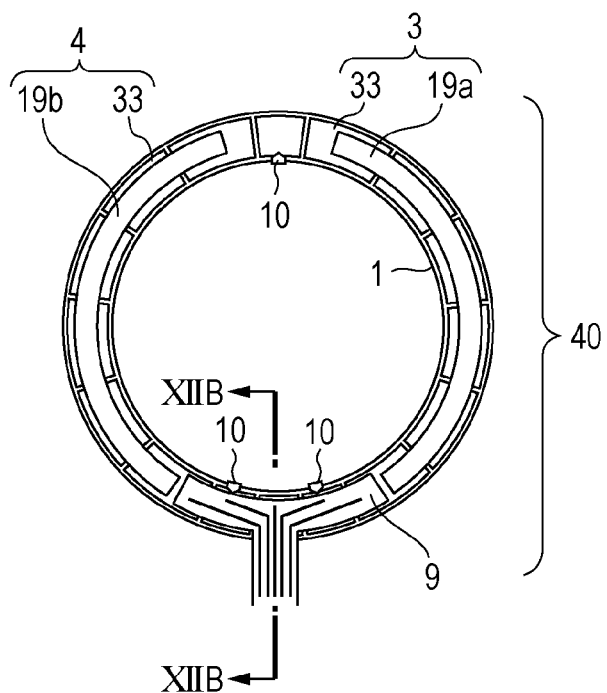
FIGS. 12A to 12C show a schematic process chart showing another example of the method for manufacturing a stator for an oscillatory wave motor of the oscillatory wave drive device of the present invention.
Figure 12B:
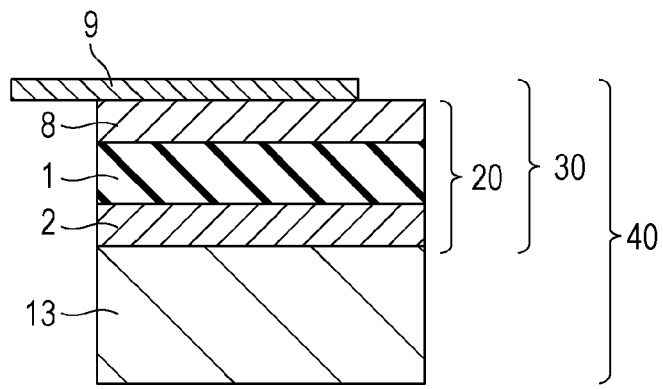
Figure 12C:
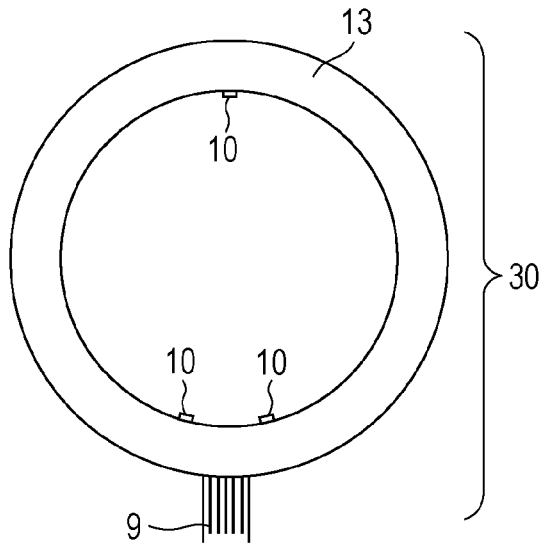

Next, as illustrated in FIGS. 12A to 12C, the piezoelectric element 30 with a power supply member was thermocompression bonded to an SUS diaphragm 13, and then the diaphragm 13 and all the ground electrodes 5 were connected with short circuit lines 10 containing silver paste to produce a stator 40 for oscillatory wave motor. The thermocompression bonding of the diaphragm and the drying of silver paste were performed at a temperature sufficiently lower than the Curie temperature of the piezoelectric material 1. FIG. 12A is a schematic plan view of one surface of the stator 40 for oscillatory wave motor. FIG. 12B is a cross sectional view of the stator 40 for oscillatory wave motor at a position along the XIIB-XIIB line in FIG. 12A. FIG. 12C a schematic plan view of the other surface opposite to FIG. 12A with the piezoelectric element 20 interposed therebetween.

A rotor was brought into contact, under pressure, with the stator 40 for oscillatory wave motor produced as described above to produce an oscillatory wave driving means of Example 1.

Furthermore, in addition to the oscillatory wave driving means, a drive phase voltage step-down means, a detection phase voltage step-down means, a drive phase noise cut means, a detection phase noise cut means, a phase difference detecting means, a control means, a drive phase electric power output means, and a drive phase voltage increasing means were disposed in such a manner as to have the configuration diagram shown in FIG. 1 to produce an oscillatory wave drive device of Example 1.

For the detection phase voltage step-down means and the drive phase voltage step-down means, a resistance voltage dividing circuit containing two resistors was used and one having a part error of the two resistors of 5% was used. Furthermore, in the detection phase voltage step-down means, the resistors were disposed in such a manner as to have a voltage dividing ratio of 1/16.

Example 2

An oscillatory wave drive device was produced in the same manner as in Example 1, except setting the voltage dividing ratio in the drive phase voltage step-down means to 1/9.

Example 3

As a piezoelectric material 1, an annular-shaped piezoelectric material 1 illustrated in FIG. 11A was produced using the following materials.

First, barium titanate with an average particle diameter of 100 nm (manufactured by SAKAI CHEMICAL INDUSTRY CO., LTD.: BT-01 (Trade name)), calcium titanate (manufactured by SAKAI CHEMICAL INDUSTRY CO., LTD.: CT-03 (Trade name)) with an average particle diameter of 300 nm, and calcium zirconate (manufactured by SAKAI CHEMICAL INDUSTRY CO., LTD.: CZ-03 (Trade name)) with an average particle diameter of 300 nm serving as the raw materials were weighed in such a manner that the molar ratio was 84.0 to 10.0 to 6.0.

Next, the weighed powder was mixed by dry blending of 24 hours using a ball mill to obtain mixed powder. In order to granulate the obtained mixed powder, manganese acetate (II) in which the Mn weight was 0.26 part by weight in terms of metal based on 100 parts by weight of the mixed powder and a PVA binder in which the weight was 3 parts by weight based on the mixed powder were individually attached to the mixed powder surface using a spray drier device.

Next, the obtained granulated powder was charged into a molding, and then a molding pressure of 200 MPa was applied to the molding using a press molding machine to produce a disk-like molded article. The molded article may be further pressurized using a cold isotropic pressure molding machine.

The obtained molded article was placed in an electric furnace, held at a temperature of 1380° C. at the maximum for 5 hours, and then sintered in the ambient atmosphere over 24 hours in total.

Next, the sintered piezoelectric material 1 was cut into an annular shape. Then, on the obtained annular-shaped piezoelectric material 1, the common electrode 2 was formed on one surface as illustrated in FIG. 11C and polarization electrodes 33, the ground electrodes 5, and the detection phase electrode 8 were formed on the other surface by screen printing of a silver paste. In this process, the interelectrode distance of the adjacent electrodes illustrated in FIG. 11B was set to 0.5 mm.

Next, polarization treatment was performed between the common electrode 2, the polarization electrodes 33, the ground electrodes 5, and the detection phase electrode 8 using a direct-current power supply in such a manner that the polarity of expansion and contraction of a piezoelectric element might are as shown in FIG. 7. The voltage was set to a degree at which a 1.0 kV/mm electric field was applied and the temperature and the voltage application time were set to 100° C. and 60 minutes, respectively. A voltage was applied until the temperature reached 40° C. during temperature dropping.

Next, in order to connect the polarization electrodes 33, connection electrodes 19a and 19b were formed with a silver paste to obtain the piezoelectric element 20 as illustrated in FIG. 11D. The silver paste was dried at a temperature sufficiently lower than the Curie temperature of the piezoelectric material 1. Herein, the resistance value of the drive phase electrode 3 was measured with a circuit tester (electric tester). One side of the tester was brought into contact with the top of the polarization electrode 33 closest to the detection phase electrode 8 and the other side was brought into contact with the top of the polarization electrode 33 farthest in the circumferential direction of the annular shape of the drive phase electrode 3. As a result, the resistance value of the electrode was 0.6Ω.

Next, as illustrated in FIG. 11E, the flexible printed circuit board 9 was stuck to the piezoelectric element 20 under pressure at room temperature using an epoxy adhesive to produce a piezoelectric element 30 with a power supply member.

Next, as illustrated in FIGS. 12A to 12C, the piezoelectric element 30 with a power supply member was thermocompression bonded to an SUS diaphragm 13, and then the diaphragm 13 and all the ground electrodes 5 were connected with short circuit lines 10 containing silver paste to produce a stator 40 for oscillatory wave motor. The thermocompression bonding of the diaphragm and the drying of silver paste were performed at a temperature sufficiently lower than the Curie temperature of the piezoelectric material 1. FIG. 12A is a schematic plan view of one surface of the stator 40 for oscillatory wave motor. FIG. 12B is a cross sectional view of the stator 40 for oscillatory wave motor at a position along XIIB-XIIB line in FIG. 12A. FIG. 12C is a schematic plan view of the other surface opposite to FIG. 12A with the piezoelectric element 20 interposed therebetween.

A rotor was brought into contact, under pressure, with the stator 40 for oscillatory wave motor produced as described above to produce an oscillatory wave driving means of Example 3.

Furthermore, in addition to the oscillatory wave driving means, a drive phase voltage step-down means, a detection phase voltage step-down means, a drive phase noise cut means, a detection phase noise cut means, a phase difference detecting means, a control means, a drive phase electric power output means, and a drive phase voltage increasing means were disposed in such a manner as to have the configuration diagram shown in FIG. 1 to produce an oscillatory wave drive device of Example 3.

For the detection phase voltage step-down means and the drive phase voltage step-down means, a resistance voltage dividing circuit containing two resistors was used and one having a part error of the two resistors of 5% was used. Furthermore, in the detection phase voltage step-down means, the resistors were disposed in such a manner as to have a voltage dividing ratio of 1/16.

Example 4

An oscillatory wave drive device was produced in the same manner as in Example 3, except setting the voltage dividing ratio in the detection phase voltage step-down means to 13/123.

Example 5

An oscillatory wave drive device was produced in the same manner as in Example 4, except setting the resistance value Rd of the resistor of R1 in the drive phase voltage step-down means and the capacity Cd in the condenser in the drive phase noise cut means and the resistance value Rs of the resistor of R1 in the detection phase voltage step-down means and the capacity Cs of the condenser in the drive phase noise cut means illustrated in FIG. 4 to CdRd/CsRs=1 as a specification value.

Example 6

An oscillatory wave drive device was produced in the same manner as in Example 5, except thermocompression bonding the flexible printed circuit board 9 to the piezoelectric element 20 using an anisotropic conductive paste (ACP) in such a manner that the temperature of the detection phase electrode of the flexible printed circuit board 9 was not 105° C. or higher to produce a piezoelectric element 30 with a power supply member, and then setting the voltage dividing ratio in the detection phase voltage step-down means to 1/2.

Example 7

An oscillatory wave drive device was produced in the same manner as in Example 6, except using one in which a part error of two resistors for use in each of the detection phase voltage step-down means and the drive phase voltage step-down means was 10%.

Comparative Example 1

An oscillatory wave drive device was produced in the same manner as in Example 1, except setting the voltage dividing ratio in the detection phase voltage step-down means to 1/28.

Comparative Example 2

An oscillatory wave drive device was produced in the same manner as in Comparative Example 1, except thermocompression bonding the flexible printed circuit board 9 to the piezoelectric element 20 at 140° C. using an anisotropic conductive paste (ACP) to produce a piezoelectric element 30 with a power supply member.

Comparative Example 3

An oscillatory wave drive device was produced in the same manner as in Comparative Example 2, except using one in which a part error of two resistors for use in each of the detection phase voltage step-down means and the drive phase voltage step-down means was 10%.

Using the oscillatory wave drive devices of Examples and Comparative Examples produced as described above, the rotation speed and the voltage value output from the detection phase when setting the load of the rotor to 150 g·cm and inputting alternating voltages of 70 V peak-to-peak value, and then sweeping frequencies of the alternating voltages in the right rotation and the left rotation of the oscillatory wave motor were evaluated as the drive performance. In each of Examples and Comparative Examples, the individual differences among the drive results of five samples, the minimum voltage (0.15 V) which can be recognized by the phase difference detecting means, a voltage (drive start detectable minimum voltage) which needs to be output at the minimum when the detection phase starts drive calculated from a detection permissible error (30°) for performing drive control by the phase difference detecting means and a variation of the voltage dividing ratios in the detection phase voltage step-down means, and the rotation speed during the process are shown in the following table 1.

One of the annular-shaped piezoelectric elements 20 of Examples and Comparative Examples was extracted for reference, and then a rectangular parallelepiped of an aspect ratio having a length equivalent to λ/4 and a width equivalent to the width of the polarization electrode was cut out from a portion where the polarization electrode 33 near the center portion of the drive phase electrode 3 was disposed. With respect to the dielectric constant changes of the rectangular parallelepiped-shaped piezoelectric material, by measuring the dielectric constant changes while increasing the temperature in a thermostat, the temperature Tc at which the dielectric constant reached the maximum was measured. Separately, a piezoelectric element obtained by similarly cutting out another rectangular parallelepiped-shaped piezoelectric material, and then heating and holding the same on a hot plate for 10 minutes was measured for the $d_{33}$ constant at room temperature with a piezoelectric constant measuring device $d_{33}$ meter (ALPHA CORPORATION) employing a Berlincourt method. The evaluation was repeated while successively increasing the temperature of the heating and holding process in increments of 5° C. to evaluate the depolarization temperature Td at which the piezoelectric constant was 95% or less of the initial piezoelectric constant. The results of Examples and Comparative Examples are shown in the following table 1.

Furthermore, the stators 40 for oscillatory wave motor of Examples and Comparative Examples were immersed in acetone in an ultrasonic cleaner for one day, and then the annular type piezoelectric element 20 was separated from the SUS diaphragm 13 and the flexible printed circuit board 9. Next, a rectangular parallelepiped was cut out from a portion where the polarization electrode 33 near the center portion of the drive phase electrode 3 was disposed to be used as a piezoelectric element for evaluating the absolute value d(1) of the piezoelectric constant. Similarly, a piezoelectric element for evaluating the absolute value d(2) of the piezoelectric constant was cut out from a region where the detection phase electrode was disposed and a piezoelectric element for evaluating the absolute value d(3) of the piezoelectric constant was cut out from a region where the non-drive phase electrodes were disposed.

These piezoelectric elements for evaluation were measured for the $d_{33}$ constant at room temperature by a Berlincourt method, and then evaluated for the absolute value d(1) of the piezoelectric constant, the absolute value d(2) of the piezoelectric constant, and the absolute value d(3) of the piezoelectric constant. The results of Examples and Comparative Examples are shown in the following table 1.

TABLE 1

| | Piezoelectric material | Resistor error | Voltage dividing ratio | Detection phase voltage step-down means | | | Drive phase voltage step-down means | | CdRd/CsRs | Rs'/Rs |
|---|---|---|---|---|---|---|---|---|---|---|
| | | | | Rs [kΩ] | Rs' [kΩ] | Cs [pF] | Rd [kΩ] | Cd [pF] | | |
| Example 1 | PZT | ±5% | 1/16 | 150 | 10 | 3900 | 330 | 3900 | 2.20 | 0.07 |
| Example 2 | PZT | ±5% | 1/9 | 240 | 30 | 3900 | 330 | 3900 | 1.38 | 0.13 |
| Example 3 | BCTZ-Mn | ±5% | 1/16 | 150 | 10 | 3900 | 330 | 3900 | 2.20 | 0.07 |
| Example 4 | BCTZ-Mn | ±5% | 13/123 | 110 | 13 | 3900 | 330 | 3900 | 3.00 | 0.12 |
| Example 5 | BCTZ-Mn | ±5% | 13/123 | 330 | 39 | 3900 | 330 | 3900 | 1.00 | 0.12 |
| Example 6 | BCTZ-Mn | ±5% | 1/2 | 330 | 330 | 3900 | 330 | 3900 | 1.00 | 1.00 |
| Example 7 | BCTZ-Mn | ±10% | 1/2 | 330 | 330 | 3900 | 330 | 3900 | 1.00 | 1.00 |
| Comparative Example 1 | PZT | ±5% | 1/28 | 270 | 10 | 3900 | 330 | 3900 | 1.22 | 0.04 |
| Comparative Example 2 | PZT | ±5% | 1/28 | 270 | 10 | 3900 | 330 | 3900 | 1.22 | 0.04 |
| Comparative Example 3 | PZT | ±10% | 1/28 | 270 | 10 | 3900 | 330 | 3900 | 1.22 | 0.04 |

| | Power supply member adhesion method | Detection phase Drive start detectable minimum voltage [V] | Rotation speed [rpm] | Tc [° C.] | Td [° C.] | d(1) [pC/N] | d(2) [pC/N] | d(3) [pC/N] |
|---|---|---|---|---|---|---|---|---|
| Example 1 | Adhesion material | 5.8 | 7.9 | 310 | 250 | 400 | 400 | 400 |
| Example 2 | Adhesion material | 3.2 | 4.3 | 310 | 250 | 400 | 400 | 400 |
| Example 3 | Adhesion material | 5.7 | 9.5 | 105 | 100 | 210 | 210 | 210 |
| Example 4 | Adhesion material | 3.4 | 5.7 | 105 | 100 | 210 | 210 | 210 |
| Example 5 | Adhesion material | 3.2 | 5.3 | 105 | 100 | 210 | 210 | 210 |
| Example 6 | ACP | 0.7 | 5.7 | 105 | 100 | 210 | 80 | 160 |
| Example 7 | ACP | 0.8 | 6.7 | 105 | 100 | 210 | 80 | 160 |
| Comparative Example 1 | Adhesion material | 10.2 | 13.9 | 310 | 250 | 400 | 400 | 400 |
| Comparative Example 2 | ACP | 10.2 | 13.9 | 310 | 250 | 400 | 400 | 400 |
| Comparative Example 3 | ACP | 11.2 | 15.3 | 310 | 250 | 400 | 400 | 400 |

(Note) The materials are the following compounds.
PZT=Pb(Zr,Ti)$O_3$
BCTZ-Mn=$(Ba_{0.84}Ca_{0.16})(Ti_{0.94}Zr_{0.06})O_3$ (100 parts by weight+Mn (0.26 part by weight))

The voltage dividing ratio of the detection phase voltage step-down means of each of Example 1 to Example 7 was in the range of 1/1 to 1/20 even when a variation of the resistors was taken into consideration, the drive start detectable minimum voltage was as low as 5.8 V or less, the rotation speed was able to be detected from a range of lower than 10 rpm, and the feedback control at the early stage of rotation was able to be performed. On the other hand, in Comparative Examples 1 to 3, the drive start detectable minimum voltage was as high as 10.2 V or more and the feedback control at the early stage of rotation in which the rotation speed was lower than 10 rpm was not able to be performed.

A comparison between Example 1 and Example 2 shows that, since the voltage dividing ratio was as high as 1/9 in Example 2, the drive start detectable minimum voltage was low and the rotation speed which was able to be detectable was low.

A comparison among Example 3, Example 4, and Example 5 shows that the voltage dividing ratios were as high as 13/123 (1/9.46) in Example 4 and Example 5, the drive start detectable minimum voltage was low and the rotation speed which was able to be detectable was low.

A comparison between Example 4 and Example 5 shows that the voltage dividing ratio was the same but since CdRd/CsRs satisfied 0.90≤CdRd/CsRs≤1.10 in Example 5, the drive start detectable minimum voltage was low and the rotation speed which was able to be detectable was low.

In Examples 6 and 7, the piezoelectric characteristics of the detection phase electrodes decreased due to the use of the ACP as the power supply member but electric signals from the detection phase electrodes were able to be distinguished by the phase difference detecting means. Moreover, the voltage dividing ratio of the detection phase voltage step-down means was large, 0.90≤CdRd/CsRs≤1.10 and 0.90≤Rs'/Rs≤1.10 were satisfied, the Td of the piezoelectric material 1 was 80° C. or higher and 160° C. or less, and d(1)>d(3)≥d(2) was satisfied, and therefore the drive start detectable minimum voltage was able to be made low, the rotation speed which was able to be detected was lower than 10 rpm, and the feedback control at the early stage of rotation was able to be performed. Moreover, it is possible to use resistors having the same resistance standard, so that the manufacturing cost was able to be reduced.

A comparison between Example 6 and Example 7 shows that, by setting the voltage dividing ratio of the detection phase voltage step-down means to 1/2, even when the part error of the two resistors for use in each of the detection phase voltage step-down means and the drive phase voltage step-down means was changed to 10% from 5%, the drive start detectable minimum voltage was able to be made low, the rotation speed which was able to be detected was lower than 10 rpm, and the feedback control at the early stage of rotation was able to be performed. In Example 7, the part error can be increased, so that a manufacturing cost reduction effect can be expected.

On the other hand, a comparison between Comparative Example 2 and Comparative Example 3, by changing the part error of the two resistors for use in each of the detection phase voltage step-down means and the drive phase voltage step-down means to 10% from 5%, the drive start detectable minimum voltage became high and the rotation speed for detecting needs to be 15 rpm or more, and thus Comparative Example 2 and Comparative Example 3 were unsuitable.

It was confirmed that the drive performance equivalent to that of Examples 3 to 7 was obtained and the feedback control at the early stage of rotation was able to be performed insofar as a piezoelectric material containing, as the main component, a perovskite type metal oxide represented by the following general formula (1),

$(Ba_{1-x}Ca_x)_b(Ti_{1-y}Zr_y)O_3$                (1).

$(1.00 < b \leq 1.02, 0.020 \leq x \leq 0.300, 0.020 \leq y \leq 0.095)$, in which Mn is contained in the metal oxide and the content of the Mn is 0.02 part by weight or more and 0.40 part by weight or less in terms of metal based on 100 parts by weight of the metal oxide is used as the piezoelectric material 1.

Example 8

The same barium titanate, calcium titanate, and calcium zirconate as those of Example 3 were weighed in such a manner as to achieve a molar ratio of 86.0 to 8.0 to 6.0. Furthermore, bismuth oxide (manufactured by Kojundo Chemical Laboratory Co., Ltd., Purity of 99.9%) was weighed in such a manner the Bi weight was 0.18 part by weight in terms of metal based on 100 parts by weight of the weighed powder, and then the weighed powder was mixed by dry mixing for 24 hours using a ball mill to obtain mixed powder. In order to granulate the obtained mixed powder, manganese acetate (II) in which the Mn weight was 0.14 part by weight in terms of metal based on 100 parts by weight of the mixed powder and a PVA binder in which the weight was 3 parts by weight based on the mixed powder were individually attached to the mixed powder surface using a spray drier device.

Next, the obtained granulated powder was charged into a molding, and then a molding pressure of 200 MPa was applied to the molding using a press molding machine to produce a disk-like molded article. The molded article may be further pressurized using a cold isostatic press molding machine.

The obtained molded article was placed in an electric furnace, held at a temperature of 1340° C. at the maximum for 5 hours, and then sintered in the ambient atmosphere over 24 hours in total.

Next, the sintered piezoelectric material 1 was cut into an annular shape. A stator 40 for oscillatory wave motor was produced using the obtained annular-shaped piezoelectric material 1 in the same manner as in Example 3, and then a rotor was brought into contact, under pressure, with the stator 40 for oscillatory wave motor to produce an oscillatory wave driving means of Example 8.

Furthermore, in addition to the oscillatory wave driving means, a drive phase voltage step-down means, a detection phase voltage step-down means, a drive phase noise cut means, a detection phase noise cut means, a phase difference detecting means, a control means, a drive phase electric power output means, and a drive phase voltage increasing means were disposed in such a manner as to have the configuration diagram shown in FIG. 1 to produce an oscillatory wave drive device of Example 8.

For the detection phase voltage step-down means and the drive phase voltage step-down means, a resistance voltage dividing circuit containing two resistors was used and one having a part error of the two resistors of 5% was used. Furthermore, in the detection phase voltage step-down means, the resistors were disposed in such a manner as to have a voltage dividing ratio of 1/16.

Example 9

An oscillatory wave drive device was produced in the same manner as in Example 8, except setting the voltage dividing ratio in a detection phase voltage step-down means to 13/123.

Example 10

An oscillatory wave drive device was produced in the same manner as in Example 8, except setting the resistance value Rd of the resistor of R1 in the drive phase voltage step-down means and the capacity Cd in the condenser in the drive phase noise cut means and the resistance value Rs of the resistor of R1 in the detection phase voltage step-down means and the capacity Cs of the condenser in the drive phase noise cut means illustrated in FIG. 4 to CdRd/CsRs=1 as a specification value.

Example 11

An oscillatory wave drive device was produced in the same manner as in Example 8, except thermocompression bonding the flexible printed circuit board 9 to the piezoelectric element 20 using an anisotropic conductive paste (ACP) in such a manner that the temperature of the detection phase electrode of the flexible printed circuit board 9 was not 103° C. or higher to produce a piezoelectric element 30 with a power supply member, and then setting the voltage dividing ratio in the detection phase voltage step-down means to 2/5.

Example 12

An oscillatory wave drive device was produced in the same manner as in Example 10, except thermocompression bonding the flexible printed circuit board 9 to the piezoelectric element 20 using an anisotropic conductive paste (ACP) in such a manner that the temperature of the detection phase electrode of the flexible printed circuit board 9 was not 103° C. or higher to produce a piezoelectric element 30 with a power supply member, and then setting the voltage dividing ratio in the detection phase voltage step-down means to 1/2.

Example 13

An oscillatory wave drive device was produced in the same manner as in Example 12, except using one in which a part error of two resistors for use in each of the detection phase voltage step-down means and the drive phase voltage step-down means was 10%.

Using the oscillatory wave drive devices of Examples 8 to 13 produced as described above, the rotation speed and the voltage value output from the detection phase when setting the load of the rotor to 150 g*cm and inputting alternating voltages of 70 V peak-to-peak value, and then sweeping frequencies of the alternating voltages in the right rotation and the left rotation of the oscillatory wave motor were evaluated as the drive performance. In each of Examples, the individual differences among the drive results of six samples, the minimum voltage (0.15 V) which can be recognized by the phase difference detecting means, a voltage (drive start detectable minimum voltage) which needs to be output at the minimum when the detection phase starts drive calculated from a detection permissible error (30°) for performing drive control by the phase difference detecting means and a variation of the voltage dividing ratios in the detection phase voltage step-down means, and the rotation speed during the process are shown in the following table 2.

One of the annular-shaped piezoelectric elements 20 of Examples 8 to 13 was extracted for reference, and then a rectangular parallelepiped of an aspect ratio having a length equivalent to λ/4 and a width equivalent to the width of the polarization electrode was cut out from a portion where the polarization electrode 33 near the center portion of the drive phase electrode 3 was disposed. With respect to the dielectric constant changes of the rectangular parallelepiped-shaped piezoelectric material, by measuring the dielectric constant changes while increasing the temperature in a thermostat, the temperature Tc at which the dielectric constant reached the maximum was measured. Separately, a piezoelectric element obtained by similarly cutting out another rectangular parallelepiped-shaped piezoelectric material, and then heating and holding the same on a hot plate for 10 minutes was measured for the $d_{33}$ constant at room temperature with a piezoelectric constant measuring device $d_{33}$ meter (ALPHA CORPORATION) employing a Berlincourt method. The evaluation was repeated while successively increasing the temperature of the heating and holding process in increments of 5° C. to evaluate the depolarization temperature Td at which the piezoelectric constant was 95% or less of the initial piezoelectric constant. The results of Examples 8 to 13 are shown in the following table 2.

Furthermore, the stators 40 for oscillatory wave motor of Examples 8 to 13 were immersed in acetone in an ultrasonic cleaner for one day, and then the annular type piezoelectric element 20 was separated from the SUS diaphragm 13 and the flexible printed circuit board 9. Next, a rectangular parallelepiped was cut out from a portion where the polarization electrode 33 near the center portion of the drive phase electrode 3 was disposed to be used as a piezoelectric element for evaluating the absolute value d(1) of the piezoelectric constant. Similarly, a piezoelectric element for evaluating the absolute value d(2) of the piezoelectric constant was cut out from a region where the detection phase electrode was disposed and a piezoelectric element for evaluating the absolute value d(3) of the piezoelectric constant was cut out from a region where the non-drive phase electrodes were disposed.

These piezoelectric elements for evaluation were measured for the $d_{33}$ constant at room temperature by a Berlincourt method, and then evaluated for the absolute value d(1) of the piezoelectric constant, the absolute value d(2) of the piezoelectric constant, and the absolute value d(3) of the piezoelectric constant. The results of Examples 8 to 13 are shown in the following table 2.

TABLE 2

| | Piezoelectric material | Resistor error | Detection phase voltage step-down means | | | | Drive phase voltage step-down means | | | |
| --- | --- | --- | --- | --- | --- | --- | --- | --- | --- | --- |
| | | | Voltage dividing ratio | Rs [kΩ] | Rs' [kΩ] | Cs [pF] | Rd [kΩ] | Cd [pF] | CdRd/CsRs | Rs'/Rs |
| Example 8 | BCTZBi-Mn | ±5% | 1/16 | 150 | 10 | 3900 | 330 | 3900 | 2.20 | 0.07 |
| Example 9 | BCTZBi-Mn | ±5% | 13/123 | 110 | 13 | 3900 | 330 | 3900 | 3.00 | 0.12 |
| Example 10 | BCTZBi-Mn | ±5% | 13/123 | 330 | 39 | 3900 | 330 | 3900 | 1.00 | 0.12 |
| Example 11 | BCTZBi-Mn | ±5% | 2/5 | 150 | 100 | 3900 | 330 | 3900 | 2.20 | 0.67 |
| Example 12 | BCTZBi-Mn | ±5% | 1/2 | 330 | 330 | 3900 | 330 | 3900 | 1.00 | 1.00 |
| Example 13 | BCTZBi-Mn | ±10% | 1/2 | 330 | 330 | 3900 | 330 | 3900 | 1.00 | 1.00 |

| | Power supply member adhesion method | Detection phase | | | | | | |
| --- | --- | --- | --- | --- | --- | --- | --- | --- |
| | | Drive start detectable minimum voltage [V] | Rotation speed [rpm] | Tc [° C.] | Td [° C.] | d(1) [pC/N] | d(2) [pC/N] | d(3) [pC/N] |
| Example 8 | Adhesion material | 5.8 | 9.2 | 103 | 95 | 315 | 315 | 315 |
| Example 9 | Adhesion material | 3.4 | 5.4 | 103 | 95 | 315 | 315 | 315 |
| Example 10 | Adhesion material | 3.2 | 5.0 | 103 | 95 | 315 | 315 | 315 |
| Example | ACP | 0.9 | 6.6 | 103 | 95 | 315 | 110 | 220 |

TABLE 2-continued

| | | | | | | | | |
|---|---|---|---|---|---|---|---|---|
| Example 11 | | | | | | | | |
| Example 12 | ACP | 0.6 | 5.2 | 103 | 95 | 315 | 110 | 220 |
| Example 13 | ACP | 0.7 | 5.5 | 105 | 95 | 315 | 110 | 220 |

(Note)
The material is the following compound. BCTZBi-Mn = $(Ba_{0.86}Ca_{0.14})(Ti_{0.94}Zr_{0.06})O_3$ (100 parts by weight + Bi (0.18 part by weight), Mn (0.14 part by weight))

The voltage dividing ratio of the detection phase voltage step-down means of each of Example 8 to Example 13 was in the range of 1/1 to 1/20 even when a variation of the resistors was taken into consideration, the drive start detectable minimum voltage was as low as 5.8 V or less, the rotation speed was able to be detected from a range of lower than 10 rpm, and the feedback control at the early stage of rotation was able to be performed.

A comparison among Example 8, Example 9, and Example 10 shows that, since the voltage dividing ratio was as high as 13/123 (1/9.46) in Examples 9 and 10, the drive start detectable minimum voltages were low and the rotation speed which was able to be detectable was low.

A comparison between Example 9 and Example 10 shows that the voltage dividing ratio was the same but since CdRd/CsRs satisfied $0.90 \leq CdRd/CsRs \leq 1.10$ in Example 10, the drive start detectable minimum voltage was low and the rotation speed which was able to be detectable was low.

In Examples 11 to 13, the piezoelectric characteristics of the detection phase electrodes decreased due to the use of the ACP as the power supply member but electric signals from the detection phase electrodes were able to be distinguished by the phase difference detecting means. The rotation speed was able to be detected from a range of lower than 10 rpm, and the feedback control at the early stage of rotation was able to be performed.

In Example 12 and Example 13, the voltage dividing ratio of the detection phase voltage step-down means was large, $0.90 \leq CdRd/CsRs \leq 1.10$ and $0.90 \leq Rs'/Rs \leq 1.10$ were satisfied, the Td of the piezoelectric material 1 was 80° C. or higher and 160° C. or less, and $d(1) > d(3) \geq d(2)$ was satisfied, and therefore the drive start detectable minimum voltage was able to be made low, the rotation speed which was able to be detected was lower than 10 rpm, and the feedback control at the early stage of rotation was able to be performed. Moreover, it is possible to use resistors having the same resistance standard, so that the manufacturing cost was able to be reduced.

A comparison between Example 12 and Example 13 shows that, by setting the voltage dividing ratio of the detection phase voltage step-down means to 1/2, even when the part error of the two resistors for use in each of the detection phase voltage step-down means and the drive phase voltage step-down means was changed to 10% from 5%, the drive start detectable minimum voltage was able to be made low, the rotation speed which was able to be detected was lower than 10 rpm, and the feedback control at the early stage of rotation was able to be performed. In Example 13, the part error can be increased, so that a manufacturing cost reduction effect can be expected.

It was confirmed that the drive performance equivalent to that of Examples 8 to 13 was obtained and the feedback control at the early stage of rotation was able to be performed insofar as a piezoelectric material containing, as the main component, a perovskite type metal oxide represented by the following general formula (1), $(Ba_{1-x}Ca_x)_b(Ti_{1-y}Zr_y)O_3$ (1), ($1.00 < b \leq 1.02$, $0.020 \leq x \leq 0.300$, $0.020 \leq y \leq 0.095$), in which Mn is contained in the metal oxide, the content of the Mn is 0.02 part by weight or more and 0.40 part by weight or less in terms of metal based on 100 parts by weight of the metal oxide, and Bi is contained in a proportion of 0.042 part by weight or more and 0.850 part by weight or less in terms of metal based on 100 parts by weight of the metal oxide is used as the piezoelectric material 1.

Optical Apparatus Employing Examples 1 to 13

An optical apparatus illustrated in FIG. 9A was produced using the same oscillatory wave drive device as those of Examples 1 to 13. Autofocus operations according to the application of alternating voltages were confirmed.

In the oscillatory wave drive device and the optical apparatus of the present invention, an input voltage value at which a control circuit can correctly judge a phase difference can be made lower than before, and therefore feedback control can be performed at a higher frequency (early stage of drive and rotation), and, based on the results, the present invention can provide an oscillatory wave drive device and an optical apparatus in which the drive and the rotation can be controlled in a shorter period of time.

The present invention can provide an oscillatory wave drive device which can lower an input voltage value at which a control circuit can correctly judge a phase difference, and feedback control can be performed from the early stage of rotation and an optical apparatus employing the same. As a result, drive and rotation can be controlled in a shorter period of time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-079013, filed Apr. 7, 2014 which is hereby incorporated by reference herein in its entirety.

What is claimed is:
1. An oscillatory wave drive device comprising:
   an oscillatory wave driving unit having an electromechanical energy conversion element having at least two drive phase electrodes and a detection phase electrode, an elastic body, and a rotor,
   a drive phase power output unit which supplies a drive phase voltage to the oscillatory wave driving unit,
   a drive phase voltage step-down unit which steps down the voltage to be supplied,
   a detection phase voltage step-down unit which steps down a detection phase voltage detected through the detection phase electrode,
   a phase difference detecting unit which detects a phase difference between the drive phase voltage and the detection phase voltage, and a control unit which controls the drive phase power output unit according to an output of the phase difference detecting unit, wherein alternating voltages different from each other in phase are applied to the two drive phase electrodes of the electromechanical energy conversion element to thereby generate a traveling wave on a surface of the elastic body, the rotor is driven by the traveling wave, and a drive state of the rotor is controlled by the control unit at least based on a signal of the phase difference detecting unit, and the detection phase voltage step-down unit and the drive phase voltage step-down unit each contain a resistance voltage dividing circuit having at least two resistors, and a voltage dividing ratio in the resistance voltage dividing circuit of the detection phase voltage step-down unit is lower than 1/1 and higher than 1/20.

2. The oscillatory wave drive device according to claim 1, further comprising a drive phase noise cut unit and a detection phase noise cut unit, wherein a condenser having a capacity Cd is disposed as the drive phase noise cut unit in series between the drive phase voltage step-down unit and the phase difference detecting unit, a condenser having a capacity Cs is disposed as the detection phase noise cut unit in series between the detection phase voltage step-down unit and the phase difference detecting unit, a resistor having a resistance value Rd is disposed as a part of the drive phase voltage step-down unit in series to the condenser having a capacity Cd, a resistor having a resistance value Rs is disposed as a part of the detection phase voltage step-down unit in series to the condenser having capacity Cs, and $0.90 \leq CdRd/CsRs \leq 1.10$ is satisfied.

3. The oscillatory wave drive device according to claim 1, wherein, among the resistors of the detection phase voltage step-down unit, the resistor having a resistance value Rs disposed in series to the detection phase noise cut unit and the resistor having a resistance value Rs' disposed in parallel to the detection phase noise cut unit satisfy $0.90 \leq Rs'/Rs \leq 1.10$.

4. The oscillatory wave drive device according to claim 1, wherein the electromechanical energy conversion element has one piece of piezoelectric material, a common electrode provided on a first surface of the piezoelectric material with the piezoelectric material interposed between surfaces, and a plurality of electrodes provided on a second surface of the piezoelectric material, and a depolarization temperature Td of the one piece of piezoelectric material is 80° C. or higher and 160° C. or less.

5. The oscillatory wave drive device according to claim 4, wherein the plurality of electrodes provided on the second surface of the one piece of piezoelectric material has at least a plurality of drive phase electrodes, a detection phase electrode, and a non-drive phase electrode, wherein a relationship between an absolute value d(1) of a piezoelectric constant of a piezoelectric material (1) of a portion sandwiched by the plurality of drive phase electrodes and the common electrode and an absolute value d(2) of a piezoelectric constant of a piezoelectric material (2) of a portion sandwiched by the detection phase electrode and the common electrode satisfies $d(1)>d(2)$.

6. The oscillatory wave drive device according to claim 5, wherein a relationship between the absolute value d(1) of the piezoelectric constant of the piezoelectric material (1), the absolute value d(2) of the piezoelectric constant of the piezoelectric material (2), and an absolute value d(3) of a piezoelectric constant of a piezoelectric material (3) of a portion sandwiched by the non-drive phase electrode and the common electrode satisfies $d(1)>d(3) \geq d(2)$.

7. The oscillatory wave drive device according to claim 4, wherein the one piece of piezoelectric material contains, as a main component, a perovskite type metal oxide represented by General Formula (1) shown below, $$(Ba_{1-x}Ca_x)_b(Ti_{1-y}Zr_y)O_3 \quad (1),$$

$(1.00<b \leq 1.02, 0.020 \leq x \leq 0.300, 0.020 \leq y \leq 0.095)$, wherein Mn is contained in the metal oxide and a content of the Mn is 0.02 part by weight or more and 0.40 part by weight or less in terms of metal based on 100 parts by weight of the metal oxide.

8. An optical apparatus, comprising the oscillatory wave device according to claim 7.

* * * * *